United States Patent
Uchiyama

(10) Patent No.: US 11,557,602 B2
(45) Date of Patent: Jan. 17, 2023

(54) SEMICONDUCTOR STORAGE DEVICE AND METHOD OF MANUFACTURING THE SAME

(71) Applicant: Kioxia Corporation, Tokyo (JP)

(72) Inventor: Yasuhiro Uchiyama, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 235 days.

(21) Appl. No.: 17/007,818

(22) Filed: Aug. 31, 2020

(65) Prior Publication Data
US 2021/0296354 A1    Sep. 23, 2021

(30) Foreign Application Priority Data

Mar. 19, 2020 (JP) .............................. JP2020-049902

(51) Int. Cl.
*H01L 27/11582* (2017.01)
*H01L 27/11565* (2017.01)
*G11C 16/04* (2006.01)

(52) U.S. Cl.
CPC .. *H01L 27/11582* (2013.01); *H01L 27/11565* (2013.01); *G11C 16/0483* (2013.01)

(58) Field of Classification Search
CPC ..................... H01L 27/11578; H01L 27/11582
See application file for complete search history.

(56) References Cited

U.S. PATENT DOCUMENTS

| 2015/0200199 | A1 | 7/2015 | Sakamoto et al. |
| 2019/0273092 | A1 | 9/2019 | Sasaki et al. |
| 2019/0363101 | A1 | 11/2019 | Kuki et al. |
| 2020/0091165 | A1* | 3/2020 | Yamashita ........ H01L 27/11582 |
| 2020/0295035 | A1* | 9/2020 | Sawa ................ H01L 29/40114 |

FOREIGN PATENT DOCUMENTS

| JP | 2019-204864 A | 11/2019 |
| TW | 201803030 A | 1/2018 |
| TW | 201937706 A | 9/2019 |

\* cited by examiner

*Primary Examiner* — Christopher A Johnson
(74) *Attorney, Agent, or Firm* — Foley & Lardner LLP

(57) ABSTRACT

A semiconductor storage device includes: a stacked body having a plurality of insulating layers and a plurality of gate electrode layers alternately stacked in a first direction, the plurality of gate electrode layers including a first gate electrode layer and a second gate electrode layer, the second gate electrode layer adjacent to the first gate electrode layer in the first direction, and the plurality of insulating layers including a first insulating layer located between the first gate electrode layer and the second gate electrode layer; a semiconductor layer extending in the first direction; a first charge storage layer disposed between the semiconductor layer and the first gate electrode layer, the first charge storage layer including silicon and nitrogen; a second charge storage layer disposed between the semiconductor layer and the second gate electrode layer, the second charge storage layer sandwiching the first insulating layer with the first charge storage layer.

13 Claims, 29 Drawing Sheets

CROSS SECTION TAKEN ALONG LINE DD'

CROSS SECTION TAKEN ALONG LINE CC'

SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2020-049902, filed Mar. 19, 2020, the entire contents of which are incorporated herein by reference.

FIELD

Embodiments described herein relate generally to a semiconductor storage device and a method of manufacturing the same.

BACKGROUND

A three-dimensional NAND flash memory in which memory cells are three-dimensionally arranged provides high integration and low cost. In the three-dimensional NAND flash memory, for example, a memory hole passing through a stacked body is formed in the stacked body in which a plurality of insulating layers and a plurality of gate electrode layers are stacked alternately. A charge storage layer and a semiconductor layer are formed in the memory hole, thereby forming a memory string in which a plurality of memory cells are connected in series. Data is stored in the memory cells by controlling an amount of charges stored in the charge storage layer.

DETAILED DESCRIPTION

Figure 1:
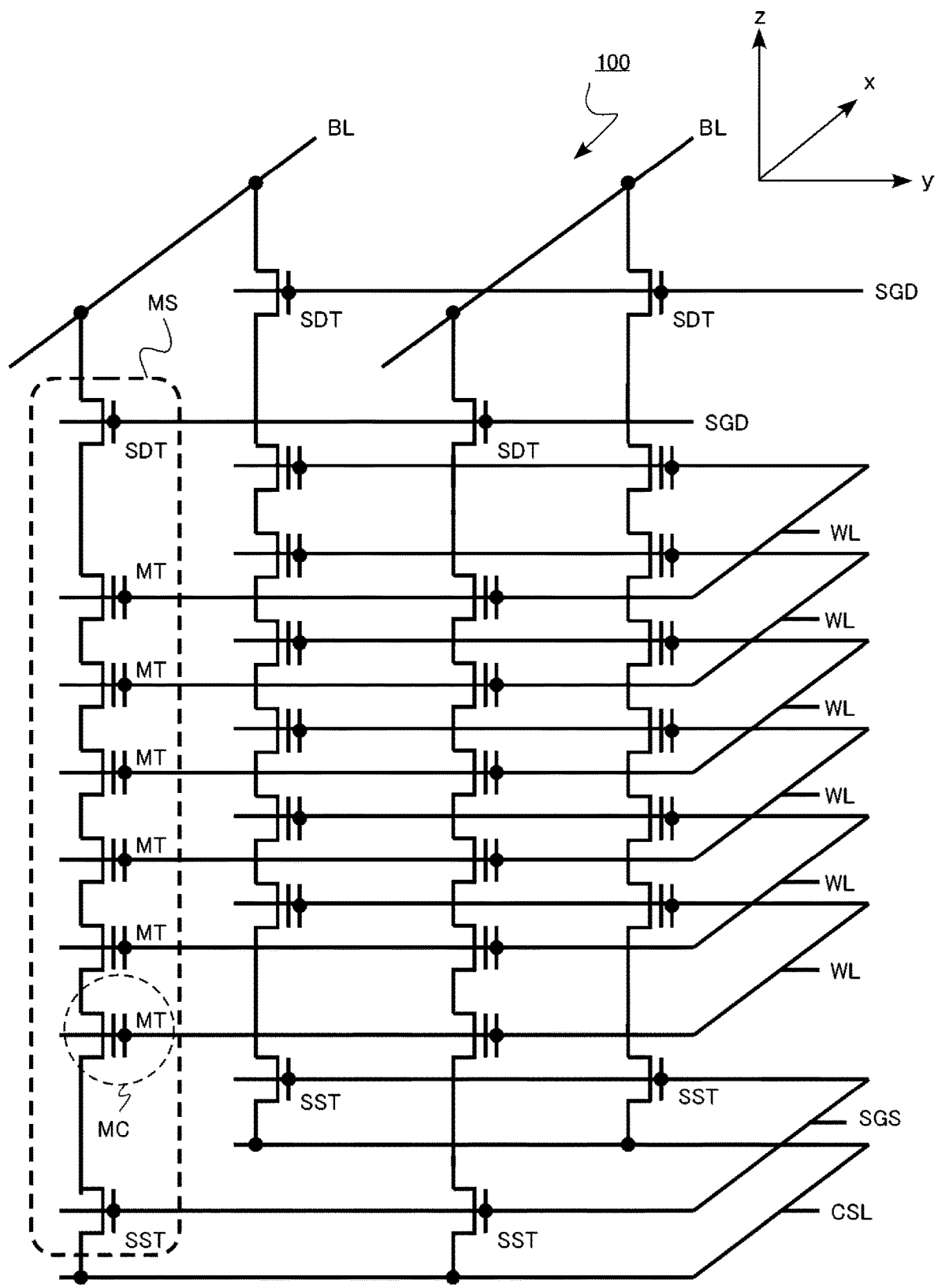
FIG. 1 is a circuit diagram of a memory cell array of a semiconductor storage device according to a first embodiment.

Embodiments provide a semiconductor storage device capable of improving charge retention property.

In general, according to at least one embodiment, the semiconductor storage device includes: a stacked body having a plurality of insulating layers and a plurality of gate electrode layers alternately stacked in a first direction, the plurality of gate electrode layers including a first gate electrode layer and a second gate electrode layer, the second gate electrode layer adjacent to the first gate electrode layer in the first direction, and the plurality of insulating layers including a first insulating layer located between the first gate electrode layer and the second gate electrode layer; a semiconductor layer extending in the first direction; a first charge storage layer disposed between the semiconductor layer and the first gate electrode layer, the first charge storage layer including silicon (Si) and nitrogen (N); a second charge storage layer disposed between the semiconductor layer and the second gate electrode layer, the second charge storage layer sandwiching the first insulating layer with the first charge storage layer, and including silicon (Si) and nitrogen (N) separated from the first charge storage layer; a first insulating film disposed between the semiconductor layer and the first charge storage layer, between the semiconductor layer and the second charge storage layer, and between the semiconductor layer and the first insulating layer; a second insulating film provided between the first insulating film and the first charge storage layer, between the first insulating film and the second charge storage layer, and between the first insulating film and the first insulating layer, the second insulating film including silicon (Si) and nitrogen (N), being in contact with the first charge storage layer and the second charge storage layer, and having a chemical composition different from that of the first charge storage layer and from that of the second charge storage layer; and a second insulating layer disposed between the first charge storage layer and the first gate electrode layer.

Hereinafter, embodiments of the present disclosure will be described with reference to the drawings. In the following description, the same or similar members are denoted by the same reference numerals, and descriptions of the members once described are appropriately omitted.

In the present specification, a term "up" or "down" may be used for convenience. The term "up" or "down" is a term indicating, for example, a relative positional relationship in the drawings. The term. "up" or "down" does not necessarily define a positional relationship with respect to gravity.

Qualitative and quantitative analyses for analyzing a chemical composition of a member forming a semiconductor storage device in the present specification may be performed by, for example, secondary ion mass spectrometry (SIMS), and energy dispersive X-ray spectroscopy (EDX). A transmission electron microscope (TEM) or the like may be used to measure a thickness of the member forming the semiconductor storage device, a distance between members, or the like.

First Embodiment

A semiconductor storage device according to a first embodiment includes: a stacked body in which a plurality of insulating layers and a plurality of gate electrode layers are alternately stacked in a first direction, the plurality of gate electrode layers including a first gate electrode layer and a second gate electrode layer adjacent to the first gate electrode layer in the first direction, and the plurality of insulating layers including a first insulating layer located between the first gate electrode layer and the second gate electrode layer; a semiconductor layer extending in the first direction; a first charge storage layer provided between the semiconductor layer and the first gate electrode layer and including silicon (Si) and nitrogen (N); a second charge storage layer provided between the semiconductor layer and the second gate electrode layer, sandwiching the first insulating layer with the first charge storage layer, and including silicon (Si) and nitrogen (N) separated from the first charge storage layer; a first insulating film provided between the semiconductor layer and the first charge storage layer, between the semiconductor layer and the second charge storage layer, and between the semiconductor layer and the first insulating layer; a second insulating film provided between the first insulating film and the first charge storage layer, between the first insulating film and the second charge storage layer, and between the first insulating film and the first insulating layer, including silicon (Si) and nitrogen (N), being in contact with the first charge storage layer and the second charge storage layer, and having a chemical composition different from that of the first charge storage layer and that of the second charge storage layer; a second insulating layer provided between the first gate electrode layer and the first charge storage layer; and a third insulating layer provided between the second gate electrode layer and the second charge storage layer.

The semiconductor storage device according to the first embodiment may be a three-dimensional NAND flash memory. A memory cell of the semiconductor storage device according to the first embodiment may be a so-called Metal-Oxide-Nitride-Oxide-Semiconductor (MONOS) memory cell.

FIG. 1 is a circuit diagram of a memory cell array 100 of the semiconductor storage device according to the first embodiment.

The memory cell array 100 of the three-dimensional NAND flash memory according to the first embodiment includes a plurality of word lines WLs, a common source line CSL, a source select gate line SGS, a plurality of drain select gate lines SGDs, a plurality of bit lines BLs, and a plurality of memory strings MSs, as shown in FIG. 1.

The plurality of word lines WLs are arranged apart from one another in a z direction. The plurality of word lines WLs are stacked and arranged in the z direction. The plurality of memory strings MSs extend in the z direction. The plurality of bit lines BLs extend in an x direction, for example.

Hereinafter, the x direction is defined as a second direction, a y direction is defined as a third direction, and the z direction is defined as the first direction. The x direction, the y direction, and the z direction are, for example, perpendicular to one another.

As shown in FIG. 1, the memory string MS includes a source select transistor SST, a plurality of memory cell transistors MTs, and a drain select transistor SDT that were connected in series between the common source line CSL and the bit line BL. One memory string MS can be selected by selecting one bit line BL and one drain select gate line SGD, and one memory cell MC can be selected by selecting one word line WL. The word line WL functions as a gate electrode of the memory cell transistor MT that forms the memory cell MC.

Figure 2A:
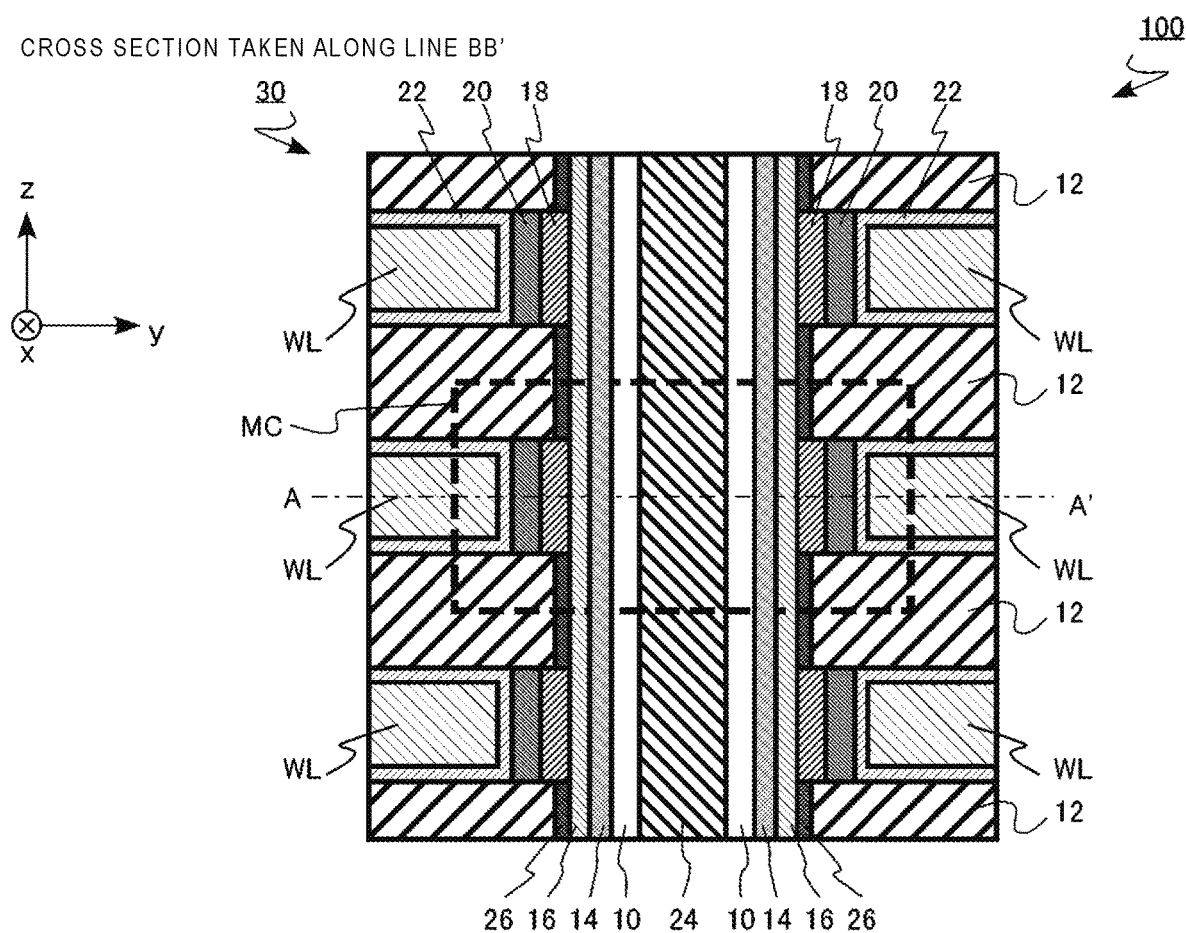
FIGS. 2A and 2B show schematic cross-sectional views of the memory cell array of the semiconductor storage device according to the first embodiment.
Figure 2B:
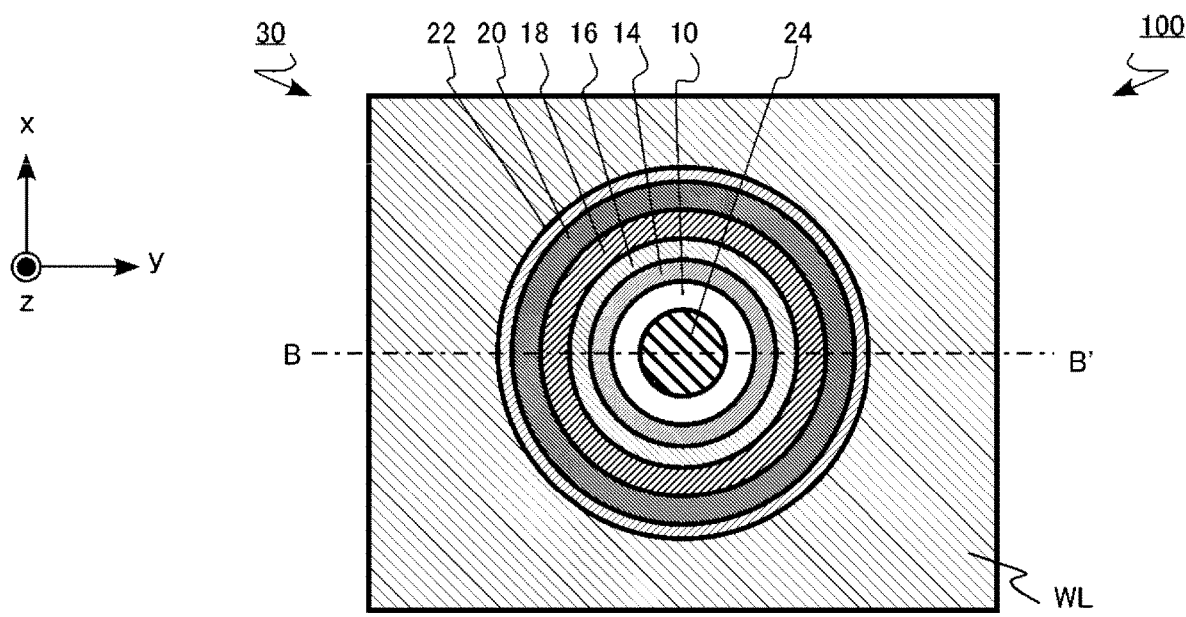

FIGS. 2A and 2B show schematic cross-sectional views showing the memory cell array 100 of the semiconductor storage device according to the first embodiment. FIGS. 2A and 2B show cross sections of a plurality of memory cells MCs in one memory string MS, for example, surrounded by a dotted line in the memory cell array 100 of FIG. 1.

FIG. 2A is a cross-sectional view of the memory cell array 100 in a yz plane. FIG. 2A is a cross section of FIG. 2B taken along a line BB'. FIG. 2B is a cross-sectional view of the memory cell array 100 in an xy plane. FIG. 2B is a cross section of FIG. 2A taken along a line AA'. In FIG. 2A, a region surrounded by a broken line is one memory cell MC.

As shown in FIGS. 2A and 2B, the memory cell array 100 includes, for example, the plurality of word lines WLs, a semiconductor layer 10, a plurality of interlayer insulating layers 12, a tunnel insulating film 14, an intermediate insulating film 16, a plurality of charge storage layers 18, a plurality of lower block insulating layers 20, a plurality of upper block insulating layers 22, a core insulating layer 24 and a cover insulating film 26. The plurality of word lines WLs and the plurality of interlayer insulating layers 12 form a stacked body 30.

The interlayer insulating layer 12 is an example of the insulating layer. The word line WL is an example of the gate electrode layer. The tunnel insulating film 14 is an example of the first insulating film. The intermediate insulating film 16 is an example of the second insulating film.

The memory cell array 100 is provided, for example, on a semiconductor substrate (not shown). The semiconductor substrate has a surface parallel to the x direction and the y direction.

The word lines WLs and the interlayer insulating layers 12 are alternately stacked in the z direction (the first direction) on the semiconductor substrate. The word lines WLs are arranged apart from one another in the z direction. The word lines WLs are spaced apart from each other and repeatedly arranged in the z direction. The plurality of word lines WLs and the plurality of interlayer insulating layers 12 form the stacked body 30. The word line WL functions as a control electrode of the memory cell transistor MT.

The word line WL is a plate-shaped conductor. The word line WL is, for example, a metal, a metal nitride, a metal carbide, or a semiconductor. The word line WL is, for example, tungsten (W). A thickness of the word line WL in the z direction is, for example, 5 nm or more and 20 nm or less.

The interlayer insulating layer 12 separates one word line WL from another word line WL. The interlayer insulating layer 12 electrically separates one word line WL from another word line WL.

The interlayer insulating layer 12 is, for example, an oxide, an oxynitride, or a nitride. The interlayer insulating layer 12 is, for example, silicon oxide. A thickness of the interlayer insulating layer 12 in the z direction is, for example, 5 nm or more and 20 nm or less.

The semiconductor layer 10 is provided in the stacked body 30. The semiconductor layer 10 extends in the z direction. The semiconductor layer 10 extends in a direction perpendicular to a surface of the semiconductor substrate.

The semiconductor layer 10 penetrates the stacked body 30. The semiconductor layer 10 is surrounded by the plurality of word lines WLs. The semiconductor layer 10 has, for example, a cylindrical shape. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating film 14 is provided between the semiconductor layer 10 and the word line WL. The tunnel insulating film 14 is provided between the semiconductor layer 10 and the plurality of word lines WLs. The tunnel insulating film 14 is provided between the semiconductor layer 10 and the charge storage layer 18. The tunnel insulating film 14 is provided between the semiconductor layer 10 and the intermediate insulating film 16.

The tunnel insulating film 14 has a function of causing charges to pass therethrough according to a voltage to be applied between the word line WL and the semiconductor layer 10.

The tunnel insulating film 14 includes, for example, silicon (Si) and oxygen (O). The tunnel insulating film 14 includes, for example, silicon (Si), oxygen (O), and nitrogen (N).

The tunnel insulating film 14 includes, for example, silicon oxide or silicon oxynitride. The tunnel insulating film 14 is, for example, a stacked film in which a silicon oxide film, a silicon oxynitride film, and a silicon oxide film are stacked.

A thickness of the tunnel insulating film 14 in the y direction is, for example, 3 nm or more and 8 nm or less.

The intermediate insulating film 16 is provided between the tunnel insulating film 14 and the charge storage layer 18. The intermediate insulating film 16 is provided between the tunnel insulating film 14 and the interlayer insulating layer 12. The intermediate insulating film 16 is in contact with the charge storage layer 18.

The intermediate insulating film 16 functions as a seed film when the charge storage layer 18 is formed by vapor phase growth.

The intermediate insulating film 16 includes silicon (Si) and nitrogen (N). The intermediate insulating film 16 includes, for example, silicon nitride. The intermediate insulating film 16 is, for example, a silicon nitride film.

The intermediate insulating film 16 includes, for example, silicon (Si), nitrogen (N), and oxygen (O). The intermediate insulating film 16 includes, for example, silicon oxynitride.

The intermediate insulating film 16 includes a chemical composition different from that of the charge storage layer 18.

A thickness of the intermediate insulating film 16 in the y direction is, for example, 1 nm or more and 5 nm or less.

The charge storage layer 18 is provided between the tunnel insulating film 14 and the word line WL. The charge storage layer 18 is provided between the tunnel insulating film 14 and the lower block insulating layer 20. The plurality of charge storage layers 18 are separated from one another. The interlayer insulating layer 12 is sandwiched between two charge storage layers 18 which are adjacent to each other in the z direction.

The charge storage layer 18 has a function of trapping and storing charges. The charge is, for example, an electron. A threshold voltage of the memory cell transistor MT changes according to an amount of the charges stored in the charge storage layer 18. By utilizing this change in the threshold voltage, the one memory cell MC can store data.

For example, when the threshold voltage of the memory cell transistor MT changes, a voltage at which the memory cell transistor MT turns on changes. For example, when a state where the threshold voltage is high is defined as data "0" and a state where the threshold voltage is low is defined as data "1", the memory cell MC can store 1-bit data of "0" and "1".

The charge storage layer 18 includes silicon (Si) and nitrogen (N). The charge storage layer 18 includes, for example, silicon nitride. The charge storage layer 18 is, for example, a silicon nitride layer.

The charge storage layer 18 includes, for example, silicon (Si), nitrogen (N), and oxygen (O). The charge storage layer 18 includes, for example, silicon oxynitride.

An atomic ratio (Si/N) of the silicon (Si) to the nitrogen (N) of the charge storage layer 18 is higher than an atomic ratio (Si/N) of the silicon (Si) to the nitrogen (N) of the intermediate insulating film 16, for example.

The charge storage layer 18 includes, for example, a metal. The charge storage layer 18 includes, for example, aluminum (Al) or titanium (Ti).

The charge storage layer 18 includes, for example, boron (B), phosphorus (P), or germanium (Ge).

A thickness of the charge storage layer 18 in the y direction is larger than the thickness of the intermediate insulating film 16 in the y direction, for example. The thickness of the charge storage layer 18 in the y direction is, for example, 3 nm or more and 10 nm or less.

The lower block insulating layer 20 is provided between the charge storage layer 18 and the word line WL. The lower block insulating layer 20 is provided between the charge storage layer 18 and the upper block insulating layer 22. The lower block insulating layer 20 is in contact with the interlayer insulating layer 12 in the z direction.

The lower block insulating layer 20 has a function of blocking a current flowing between the charge storage layer 18 and the word line WL.

The lower block insulating layers 20 include, for example, silicon oxide. The lower block insulating layers 20 include, for example, a silicon oxide layer.

A thickness of the lower block insulating layer 20 in the y direction may be, for example, 3 nm or more and 10 nm or less.

The upper block insulating layer 22 is provided between the charge storage layer 18 and the word line WL. The upper block insulating layer 22 is provided between the lower block insulating layer 20 and the word line WL. The upper block insulating layer 22 is in contact with the interlayer insulating layer 12 in the z direction.

The upper block insulating layer 22 has a function of blocking the current flowing between the charge storage layer 18 and the word line WL.

The upper block insulating layer 22 includes, for example, aluminum oxide. The upper block insulating layer 22 is, for example, an aluminum oxide layer.

The core insulating layer 24 is provided in the stacked body 30. The core insulating layer 24 extends in the z direction. The core insulating layer 24 penetrates the stacked body 30. The core insulating layer 24 is surrounded by the semiconductor layer 10. The core insulating layer 24 is surrounded by the plurality of word lines WLs. The core insulating layer 24 may have a columnar shape. The core insulating layer 24 may have, for example, a cylindrical shape.

The core insulating layer 24 is, for example, an oxide, an oxynitride, or a nitride. The core insulating layer 24 includes, for example, silicon oxide. The core insulating layer 24 is, for example, a silicon oxide layer.

The cover insulating film 26 is provided between the intermediate insulating film 16 and the interlayer insulating layer 12. The cover insulating film 26 is in contact with the intermediate insulating film 16 and the interlayer insulating layer 12.

A thickness of the cover insulating film 26 in the y direction may be, for example, 3 nm or more and 8 nm or less.

Figure 3:
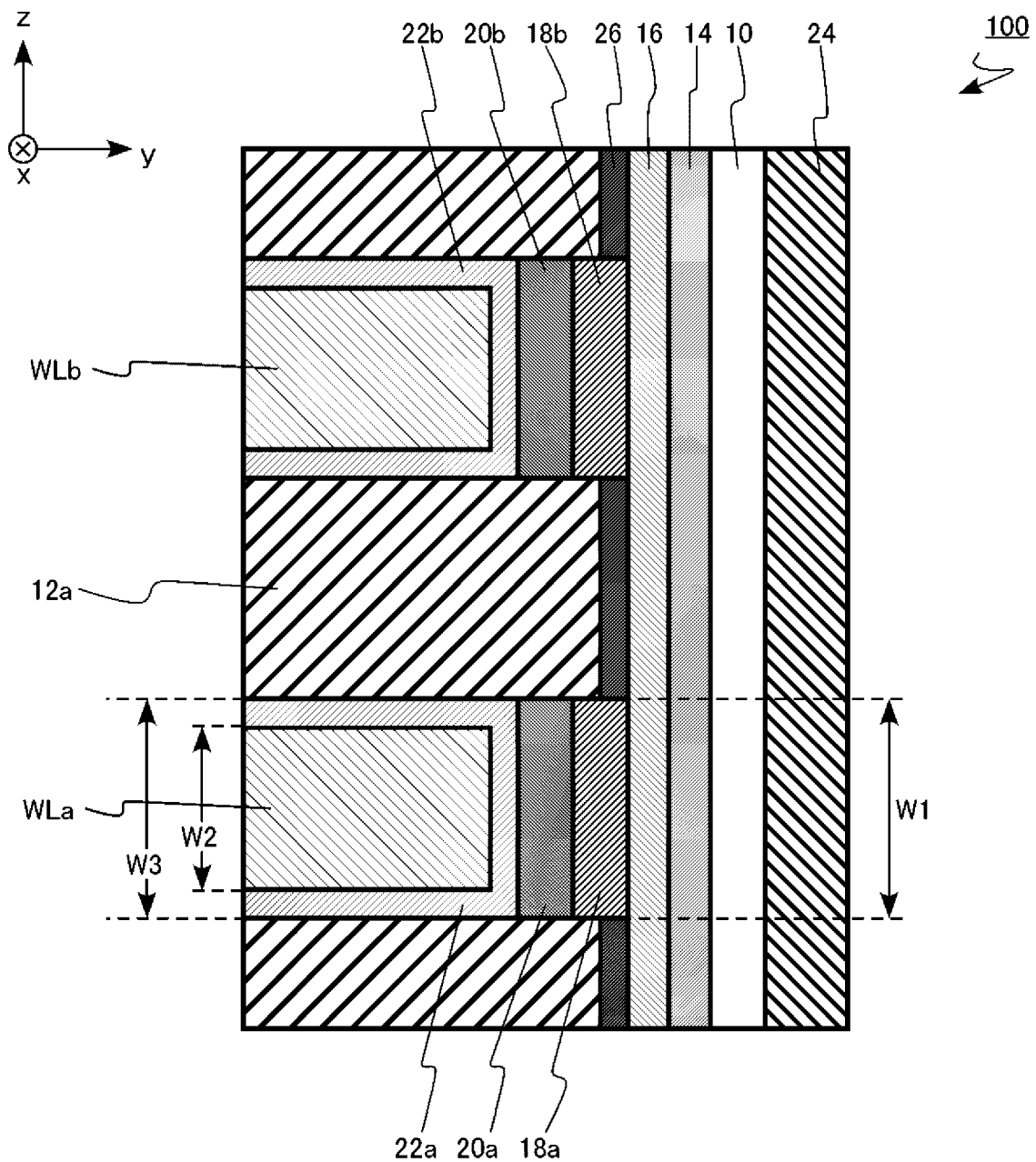
FIG. 3 is an enlarged schematic cross-sectional view of the memory cell array of the semiconductor storage device according to the first embodiment.

FIG. 3 is an enlarged schematic cross-sectional view of the memory cell array 100 of the semiconductor storage device according to the first embodiment. FIG. 3 is a partially enlarged view of FIG. 2A.

The memory cell array 100 may include a first word line WLa, a second word line WLb, the semiconductor layer 10, a first interlayer insulating layer 12a, the tunnel insulating film 14, the intermediate insulating film 16, a first charge storage layer 18a, a second charge storage layer 18b, a first lower block insulating layer 20a, a second lower block insulating layer 20b, a first upper block insulating layer 22a, a second upper block insulating layer 22b, the core insulating layer 24, and the cover insulating film 26.

Each of the first word line WLa and the second word line WLb is one of the plurality of word lines WLs. The first word line WLa is an example of the first gate electrode layer. The second word line WLb is an example of the second gate electrode layer.

The first interlayer insulating layer 12a is one of the plurality of interlayer insulating layers 12. The first interlayer insulating layer 12a is an example of the first insulating layer.

Each of the first charge storage layer 18a and the second charge storage layer 18b is one of the plurality of charge storage layers 18.

Each of the first lower block insulating layer 20a and the second lower block insulating layer 20b is one of the plurality of lower block insulating layers 20. The first lower block insulating layer 20a is an example of a first portion of the second insulating layer.

Each of the first upper block insulating layer 22a and the second upper block insulating layer 22b is one of the plurality of upper block insulating layers 22. The first upper block insulating layer 22a is an example of a second portion of the second insulating layer.

The second word line WLb is adjacent to the first word line WLa in the z direction. The first interlayer insulating layer 12a is located between the first word line WLa and the second word line WLb.

The first charge storage layer 18a is provided between the semiconductor layer 10 and the first word line WLa. The first charge storage layer 18a includes silicon (Si) and nitrogen (N).

The second charge storage layer 18b is provided between the semiconductor layer 10 and the second word line WLb. The second charge storage layer 18b includes silicon (Si) and nitrogen (N). The first interlayer insulating layer 12a is sandwiched between the second charge storage layer 18b and the first charge storage layer 18a.

The second charge storage layer 18b is physically separated from the first charge storage layer 18a.

The tunnel insulating film 14 is provided between the semiconductor layer 10 and the first charge storage layer 18a, between the semiconductor layer 10 and the second charge storage layer 18b, and between the semiconductor layer 10 and the first interlayer insulating layer 12a.

The intermediate insulating film 16 is provided between the tunnel insulating film 14 and the first charge storage layer 18a, between the tunnel insulating film 14 and the second charge storage layer 18b, and between the tunnel insulating film 14 and the first interlayer insulating layer 12a. The intermediate insulating film 16 is in contact with the first charge storage layer 18a and the second charge storage layer 18b.

The intermediate insulating film 16 includes silicon (Si) and nitrogen (N). The intermediate insulating film 16 includes a chemical composition different from that of the first charge storage layer 18a and that of the second charge storage layer 18b.

The first lower block insulating layer 20a is provided between the first charge storage layer 18a and the first word line WLa. The first upper block insulating layer 22a is provided between the first lower block insulating layer 20a and the first word line WLa.

The first lower block insulating layer 20a is in contact with the first interlayer insulating layer 12a. The first upper block insulating layer 22a is in contact with the first interlayer insulating layer 12a.

The second lower block insulating layer 20b is provided between the second charge storage layer 18b and the second word line WLb. The second upper block insulating layer 22b is provided between the second lower block insulating layer 20b and the second word line WLb.

The second lower block insulating layer 20b is in contact with the first interlayer insulating layer 12a. The second upper block insulating layer 22b is in contact with the first interlayer insulating layer 12a.

A width (W1 in FIG. 3) of the first charge storage layer 18a in the z direction (the first direction) is, for example, equal to or larger than a width (W2 in FIG. 3) of the first word line WLa in the z direction (the first direction). The width (W1 in FIG. 3) of the first charge storage layer 18a in the z direction (the first direction) is, for example, larger than the width (W2 in FIG. 3) of the first word line WLa in the z direction (the first direction).

A width (W3 in FIG. 3) of the first lower block insulating layer 20a in the z direction (the first direction) is substantially the same as the width (W1 in FIG. 3) of the first charge storage layer 18a in the z direction (the first direction). A width (W3 in FIG. 3) of the first upper block insulating layer 22a in the z direction (the first direction) is substantially the same as the width (W1 in FIG. 3) of the first charge storage layer 18a in the z direction (the first direction).

Next, an example of a method of manufacturing the semiconductor storage device according to the first embodiment will be described. Hereinafter, an example of a method of manufacturing the memory cell array 100 of the semiconductor storage device according to at least one embodiment will be described.

The method of manufacturing the semiconductor storage device according to the first embodiment includes forming a stacked body in which a plurality of first layers and a plurality of second layers are alternately stacked in a first direction, the stacked body being an insulator having a material different from those of the plurality of first layers and those of the plurality of second layers; forming an opening penetrating the stacked body and extending in the first direction; forming a first film of the insulator on an inner wall of the opening; forming a second film of the insulator including silicon (Si) and nitrogen (N) on the first film; forming a third film of the insulator on the second film; forming a semiconductor layer on the third film; selectively removing the plurality of second layers with respect to the plurality of first layers after the semiconductor layer is formed; selectively removing the first film with respect to the second film; selectively forming a third layer including silicon (Si) and nitrogen (N) and having a chemical composition different from that of the second film on the second film; forming a fourth layer of the insulator on the third layer; and forming a metal layer on the fourth layer.

FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B and FIGS. 13A and 13B show schematic cross-sectional views showing the method of manufacturing the semiconductor storage device according to the first embodiment. FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B and FIGS. 13A and 13B show cross sections corresponding to FIGS. 2A and 2B, respectively.

Figure 4A:
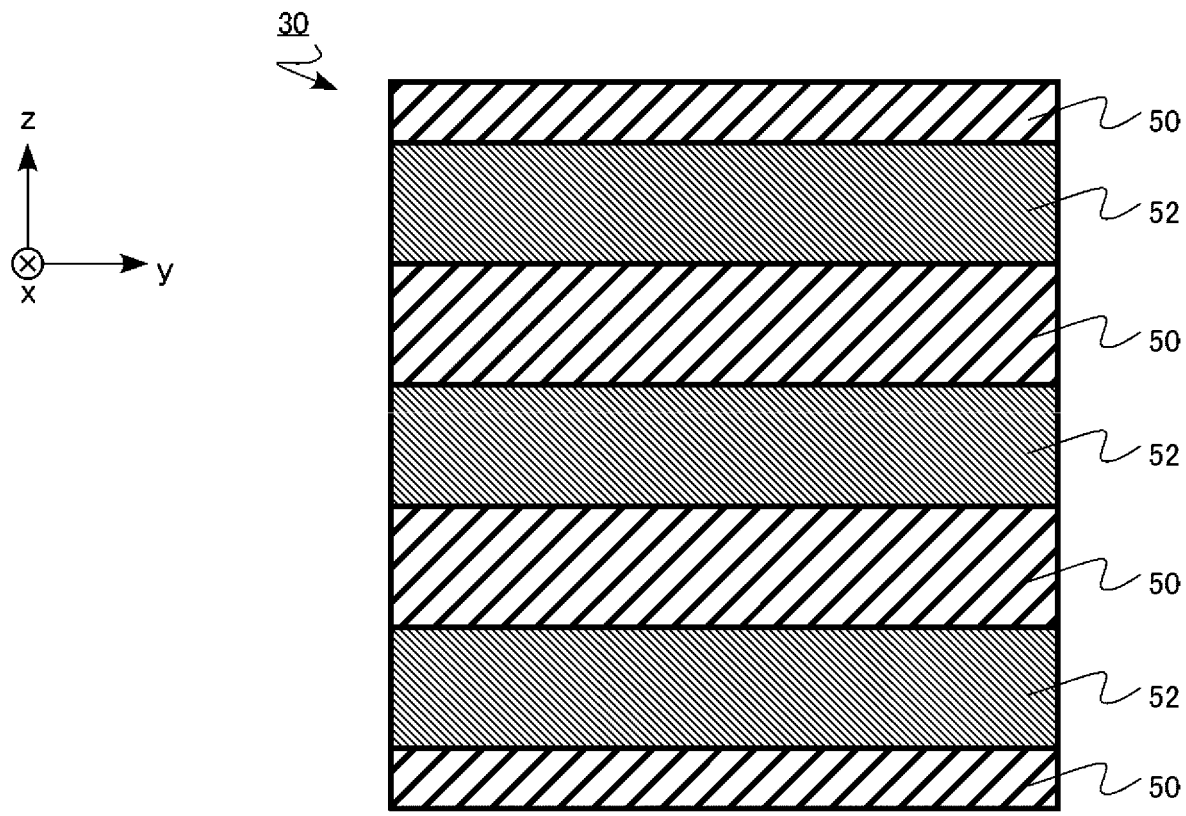
FIGS. 4A and 4B show schematic cross-sectional views showing a method of manufacturing the semiconductor storage device according to the first embodiment.
Figure 4B:
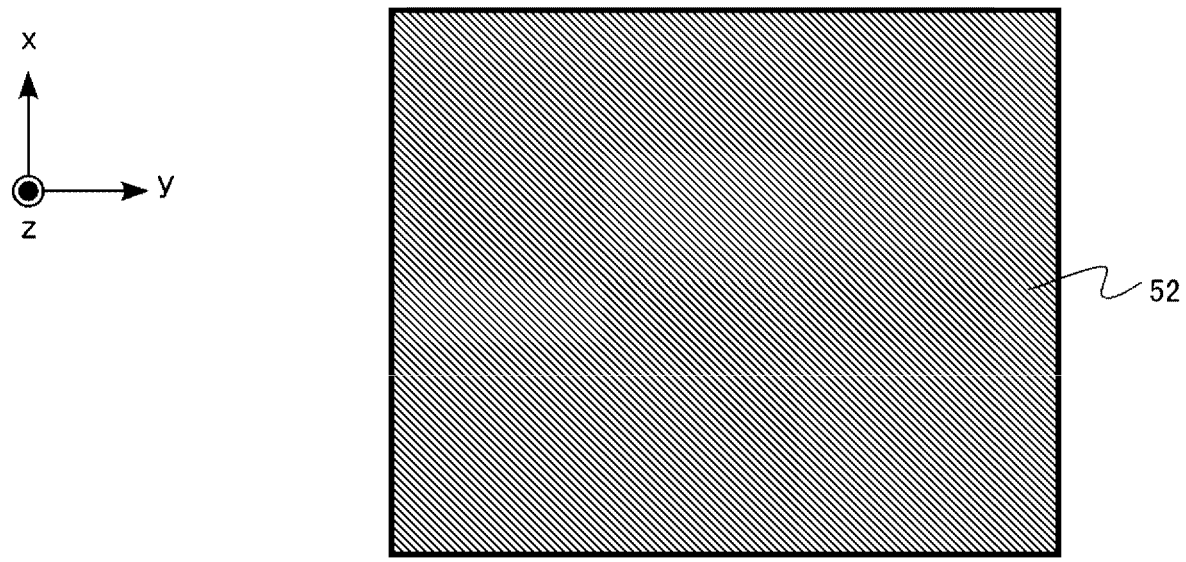

First, silicon oxide layers 50 and silicon nitride layers 52 are alternately stacked on the semiconductor substrate (not shown) (FIGS. 4A and 4B). The stacked body 30, in which a plurality of silicon oxide layers 50 and a plurality of silicon nitride layers 52 were alternately stacked in the z direction (the first direction), is formed. The silicon oxide layer 50 is an example of the first layer. The silicon nitride layer 52 is an example of the second layer.

The silicon oxide layer 50 and the silicon nitride layer 52 are formed by, for example, a chemical vapor deposition method (a CVD method). A part of the silicon oxide layer 50 is finally manufactured into the interlayer insulating layer 12.

Figure 5A:
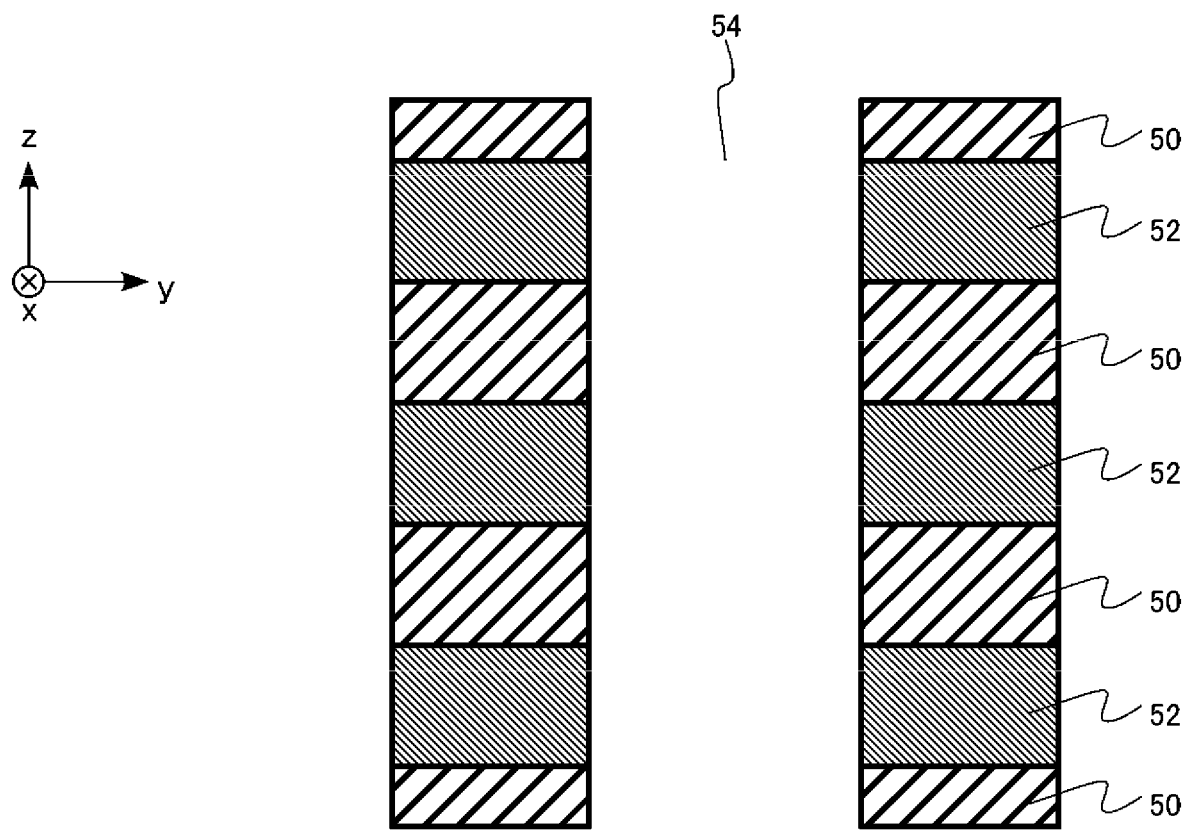
FIGS. 5A and 5B show schematic cross-sectional views showing the method of manufacturing the semiconductor storage device according to the first embodiment.
Figure 5B:
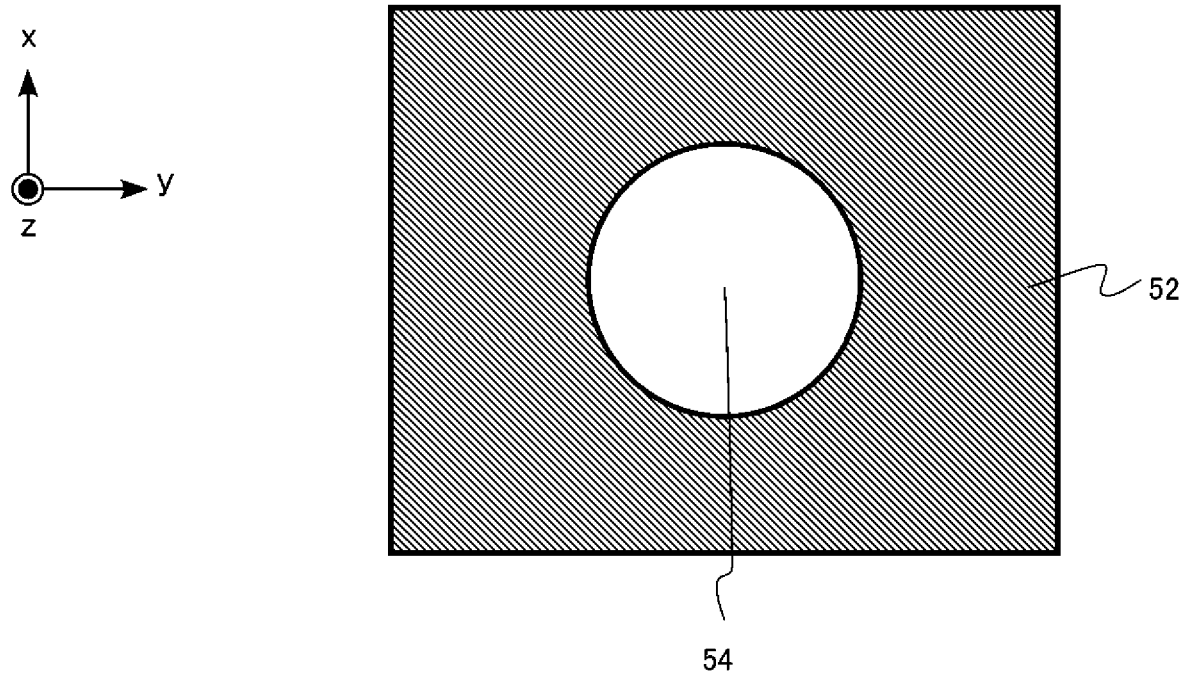

Next, a memory hole 54 is formed in the silicon oxide layers 50 and the silicon nitride layers 52 (FIGS. 5A and 5B). The memory hole 54 is an example of the opening. The memory hole 54 passes through the silicon oxide layers 50 and the silicon nitride layers 52 and extends in the z direction. The memory hole 54 is formed by, for example, a lithography method and a reactive ion etching (RIE) method.

Figure 6A:
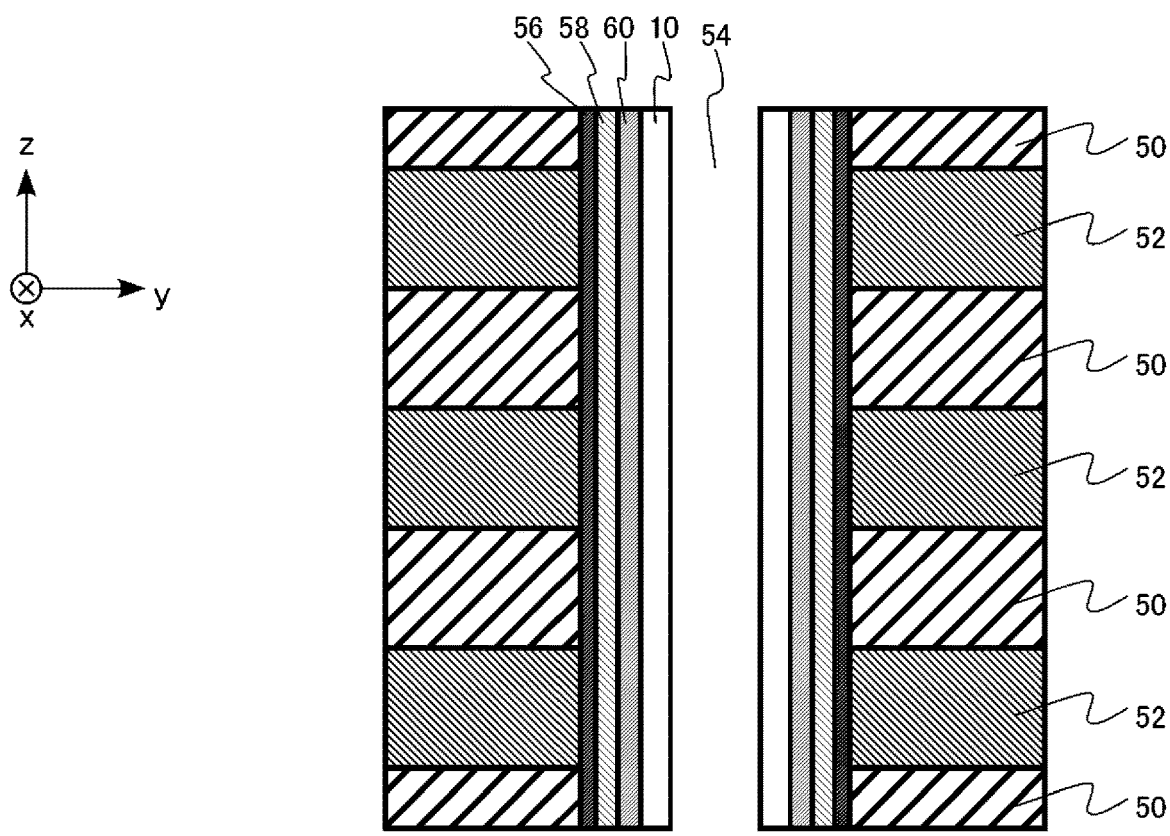
FIGS. 6A and 6B show schematic cross-sectional views showing the method of manufacturing the semiconductor storage device according to the first embodiment.
Figure 6B:
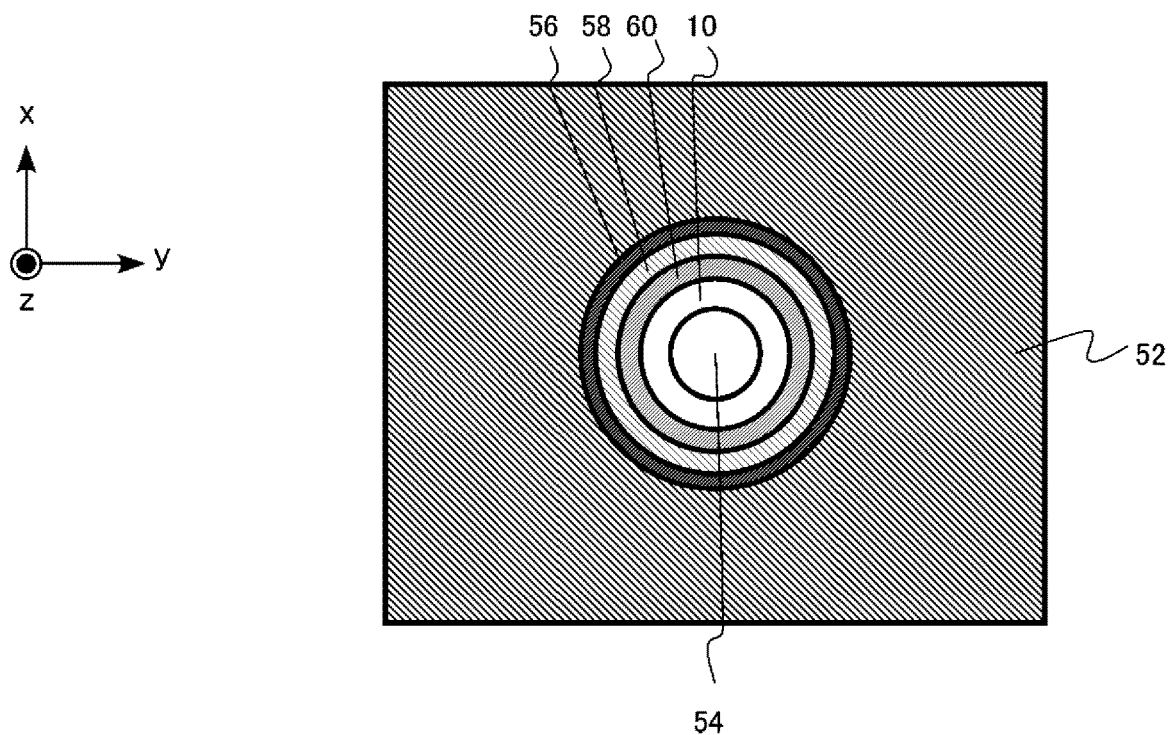

Next, a silicon oxide film 56, a silicon nitride film 58, a silicon oxide film 60, and the semiconductor layer 10 are formed on an inner wall of the memory hole 54 (FIGS. 6A and 6B). The silicon oxide film 56 is an example of the first film. The silicon nitride film 58 is an example of the second film. The silicon oxide film 60 is an example of the third film.

The silicon nitride film 58 is formed on the silicon oxide film 56. The silicon oxide film 60 is formed on the silicon nitride film 58. The semiconductor layer 10 is formed on the silicon oxide film 60. The semiconductor layer 10 is, for example, a polycrystalline silicon layer. The silicon oxide film 56, the silicon nitride film 58, the silicon oxide film 60, and the semiconductor layer 10 are formed by, for example, the CVD method.

The silicon oxide film 56 is the cover insulating film 26. The silicon nitride film 58 is the intermediate insulating film 16. The silicon oxide film 60 is the tunnel insulating film 14.

Figure 7A:
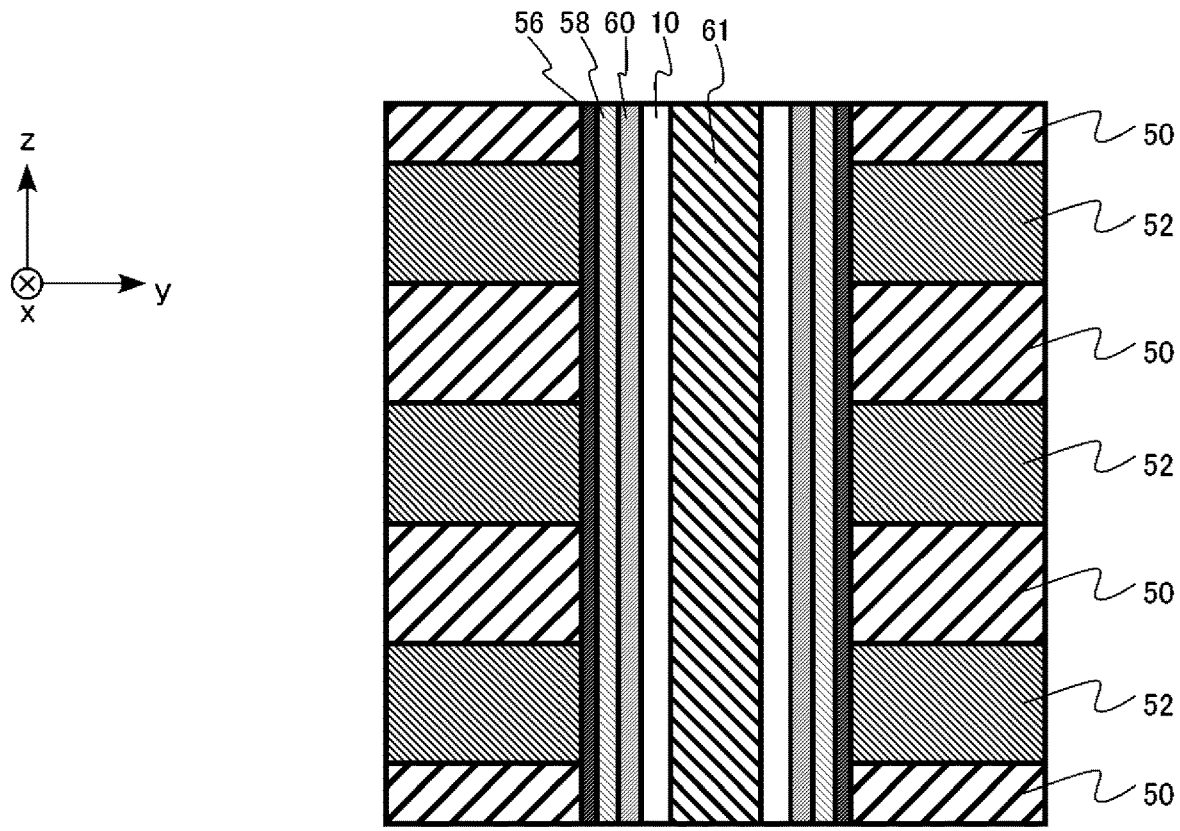
FIGS. 7A and 7B show schematic cross-sectional views showing the method of manufacturing the semiconductor storage device according to the first embodiment.
Figure 7B:
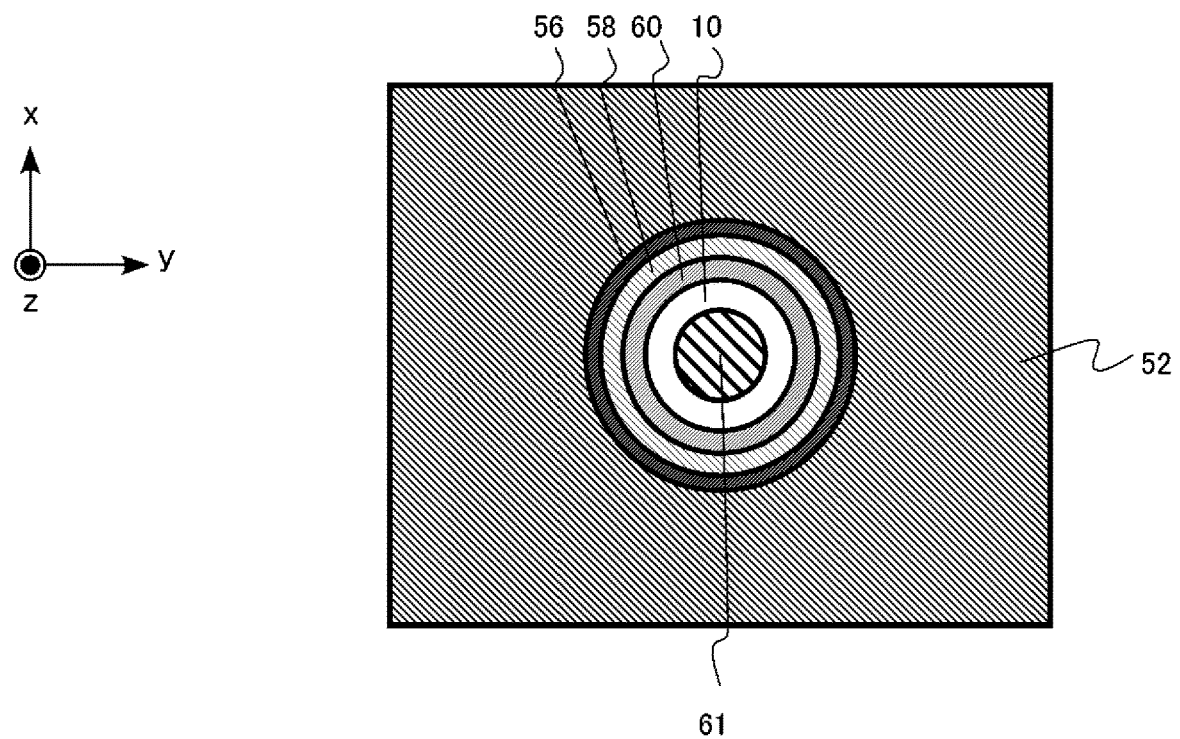

Next, the memory hole 54 is filled with a silicon oxide layer 61 (FIGS. 7A and 7B). The silicon oxide layer 61 is the core insulating layer 24.

Figure 8A:
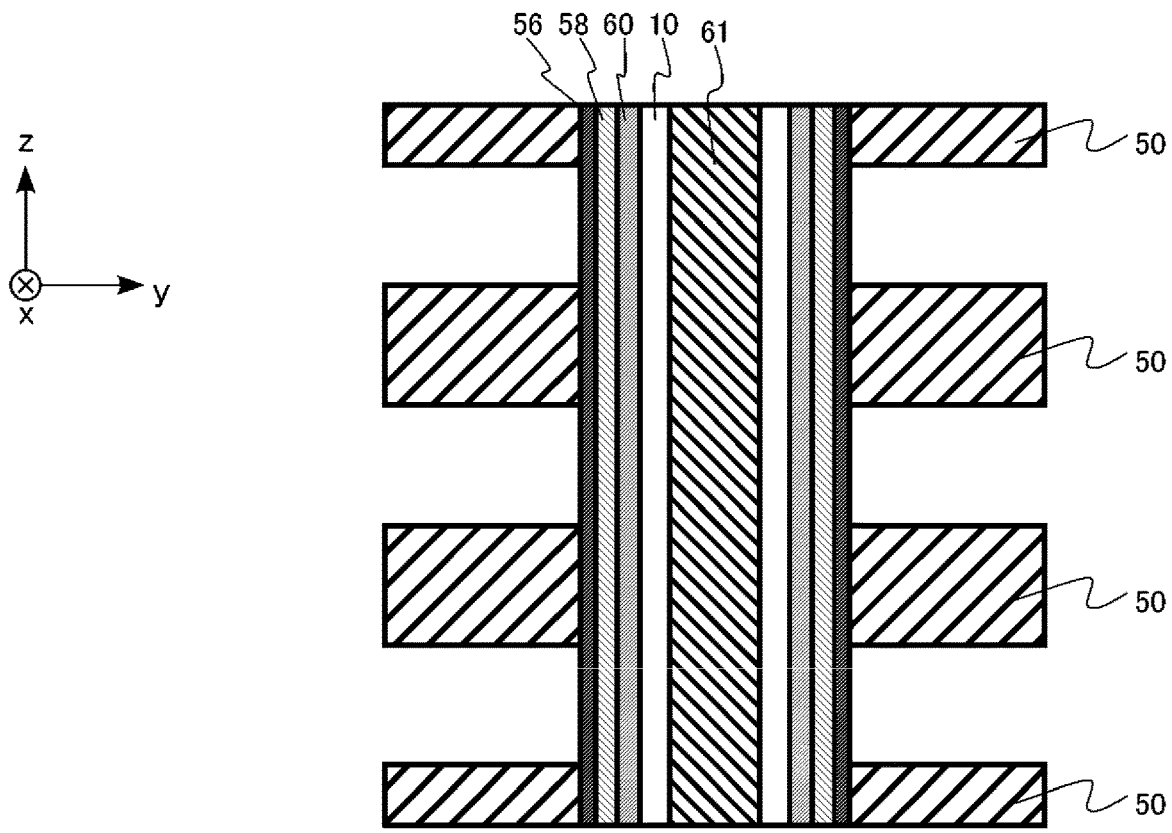
FIGS. 8A and 8B show schematic cross-sectional views showing the method of manufacturing the semiconductor storage device according to the first embodiment.
Figure 8B:
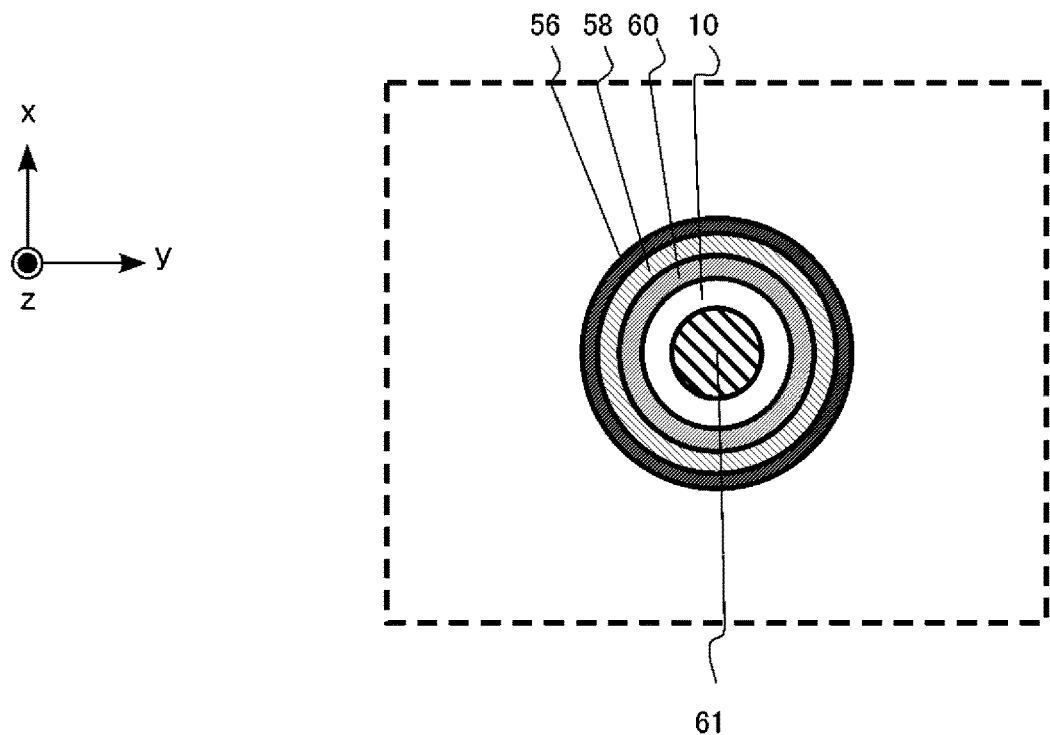

Next, the silicon nitride layers 52 are selectively removed by wet etching using the opening (not shown) provided in the stacked body 30 as a groove for etching (FIGS. 8A and 8B). In the wet etching, for example, a phosphoric acid solution is used, and the silicon nitride layers 52 are selectively etched with respect to the silicon oxide layer 50 and the silicon oxide film 56.

Figure 9A:
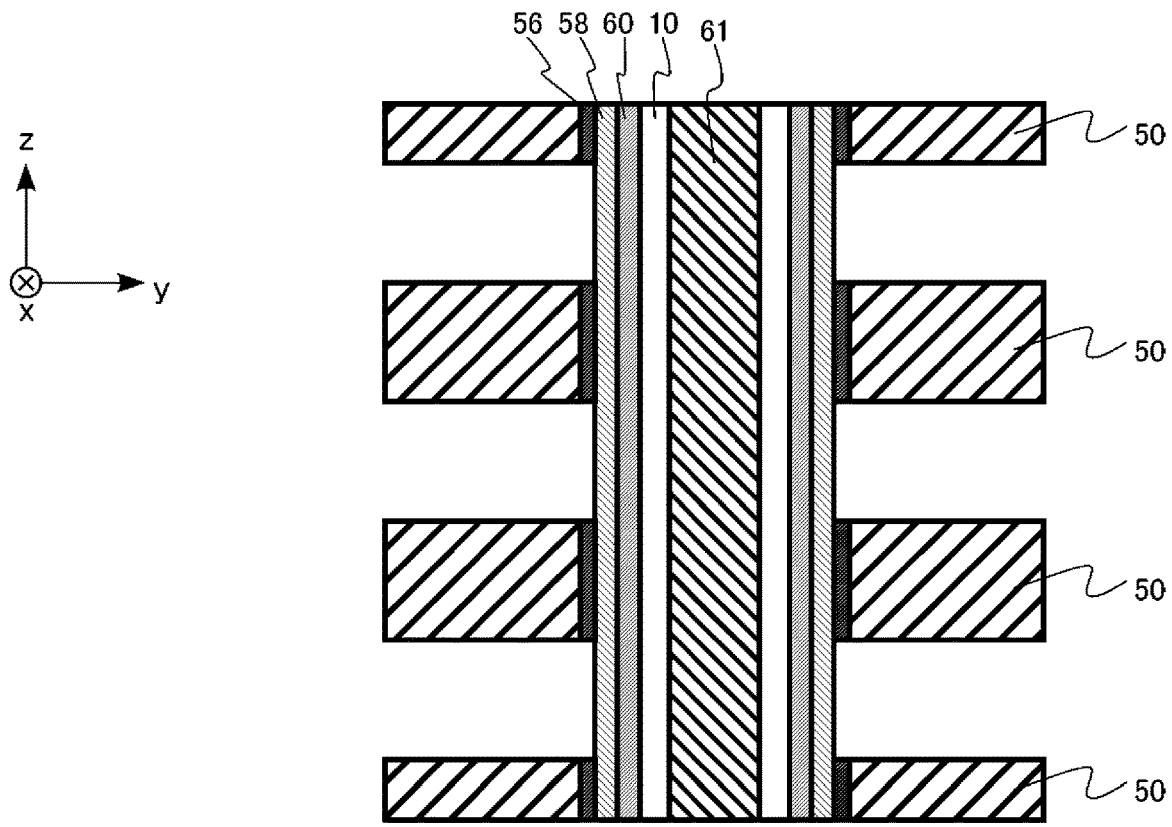
FIGS. 9A and 9B show schematic cross-sectional views showing the method of manufacturing the semiconductor storage device according to the first embodiment.
Figure 9B:
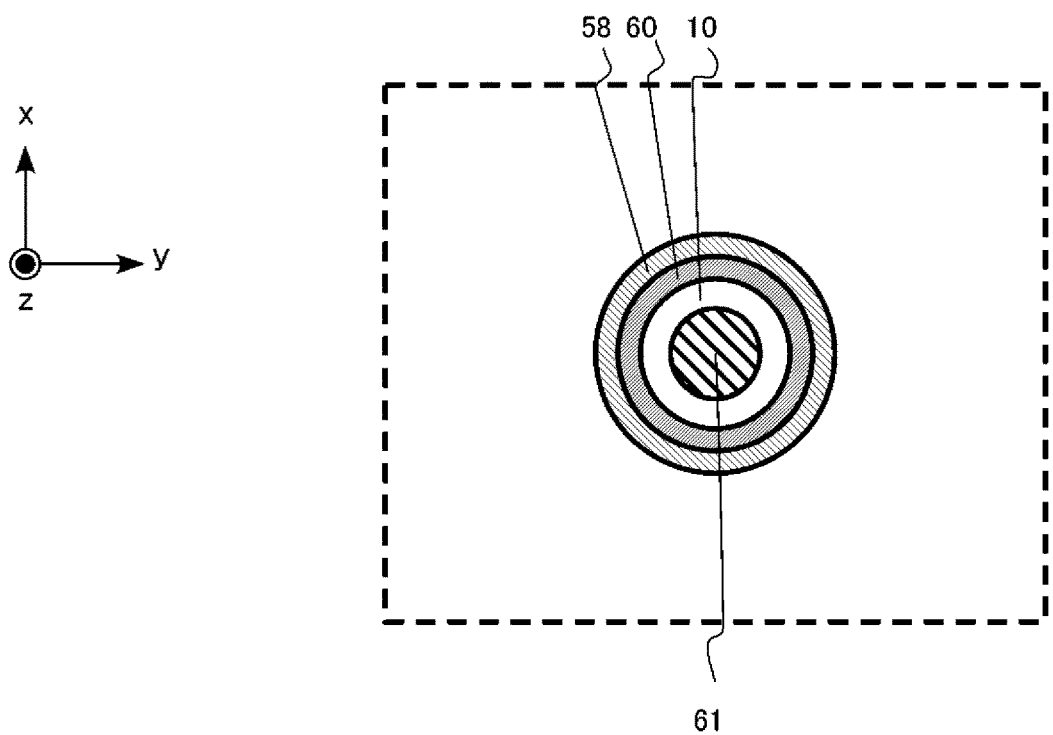

Next, the silicon oxide film 56 in a region where the silicon nitride layers 52 were removed is selectively removed with respect to the silicon nitride film 58 (FIGS. 9A and 9B). The silicon oxide film 56 is removed by, for example, the wet etching.

Figure 10A:
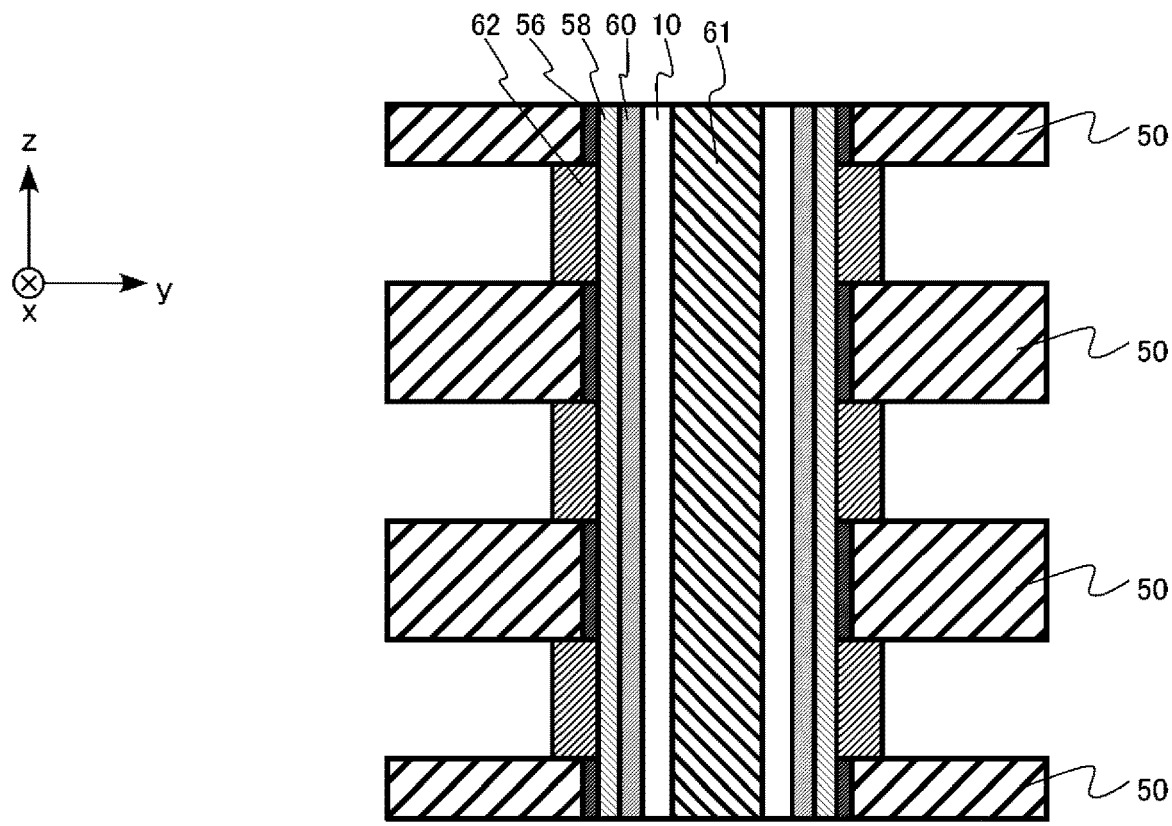
FIGS. 10A and 10B show schematic cross-sectional views showing the method of manufacturing the semiconductor storage device according to the first embodiment.
Figure 10B:
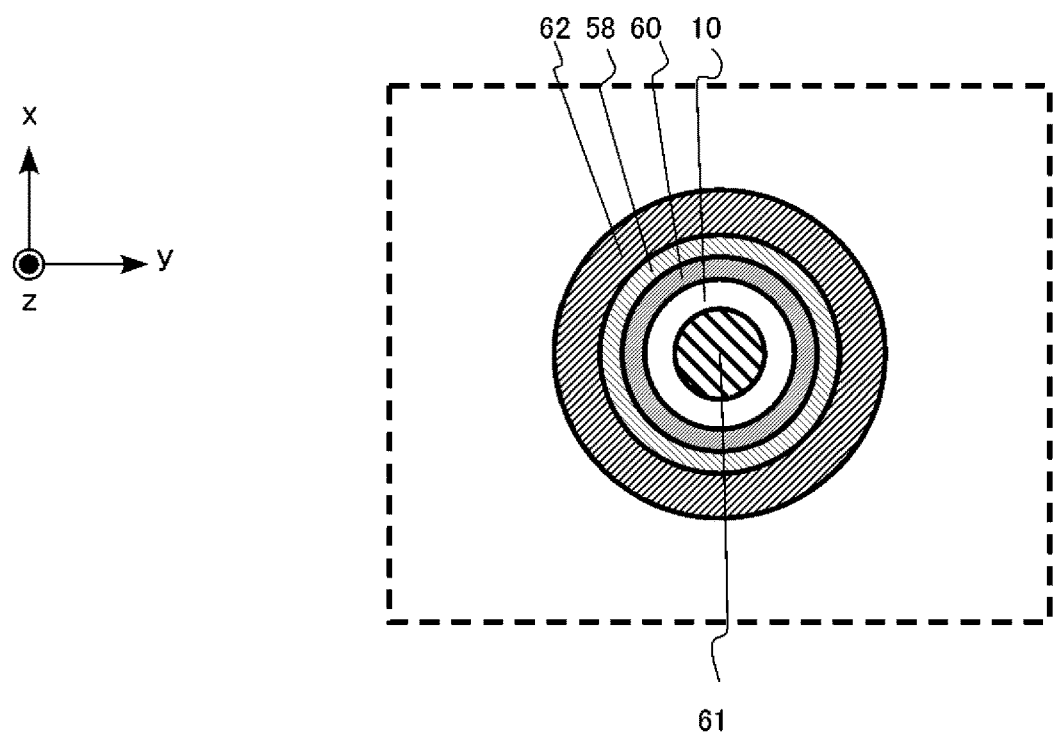

Next, a silicon nitride layer 62 is selectively formed on the silicon nitride film 58 (FIGS. 10A and 10B). The silicon nitride layer 62 is an example of the third layer. The silicon nitride layer 62 includes a chemical composition different from that of the silicon nitride film 58.

An atomic ratio (Si/N) of the silicon (Si) to the nitrogen (N) of the silicon nitride layer 62 is higher than an atomic ratio (Si/N) of the silicon (Si) to the nitrogen (N) of the silicon nitride film 58, for example.

The silicon nitride layer 62 includes, for example, a metal. The silicon nitride layer 62 includes, for example, at least one of aluminum (Al) or titanium (Ti).

The silicon nitride layer 62 includes, for example, at least one of boron (B), phosphorus (P), or germanium (Ge).

The silicon nitride layer 62 is formed by, for example, a CVD method. The silicon nitride layer 62 is selectively grown on the silicon nitride film 58 using the silicon nitride film 58 as a seed film. A part of the silicon nitride layer 62 is finally manufactured into the charge storage layer 18.

Figure 11A:
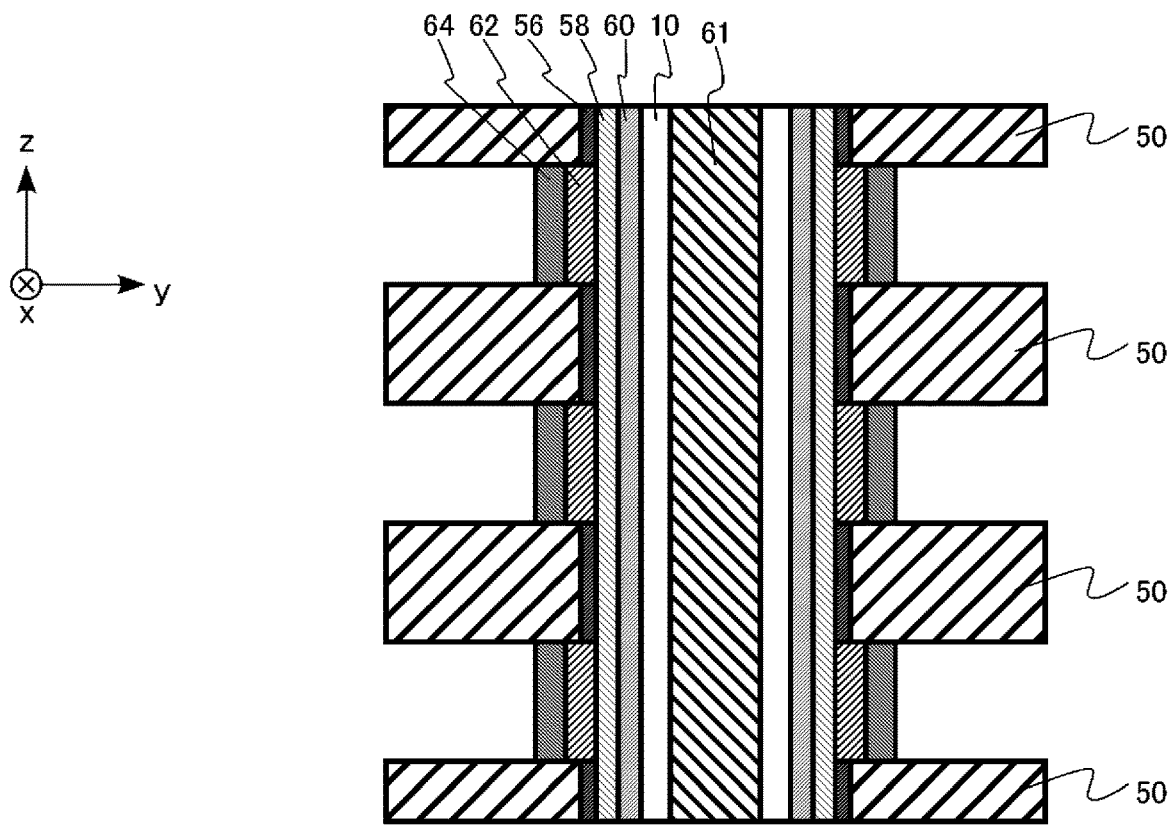
FIGS. 11A and 11B show schematic cross-sectional views showing the method of manufacturing the semiconductor storage device according to the first embodiment.
Figure 11B:
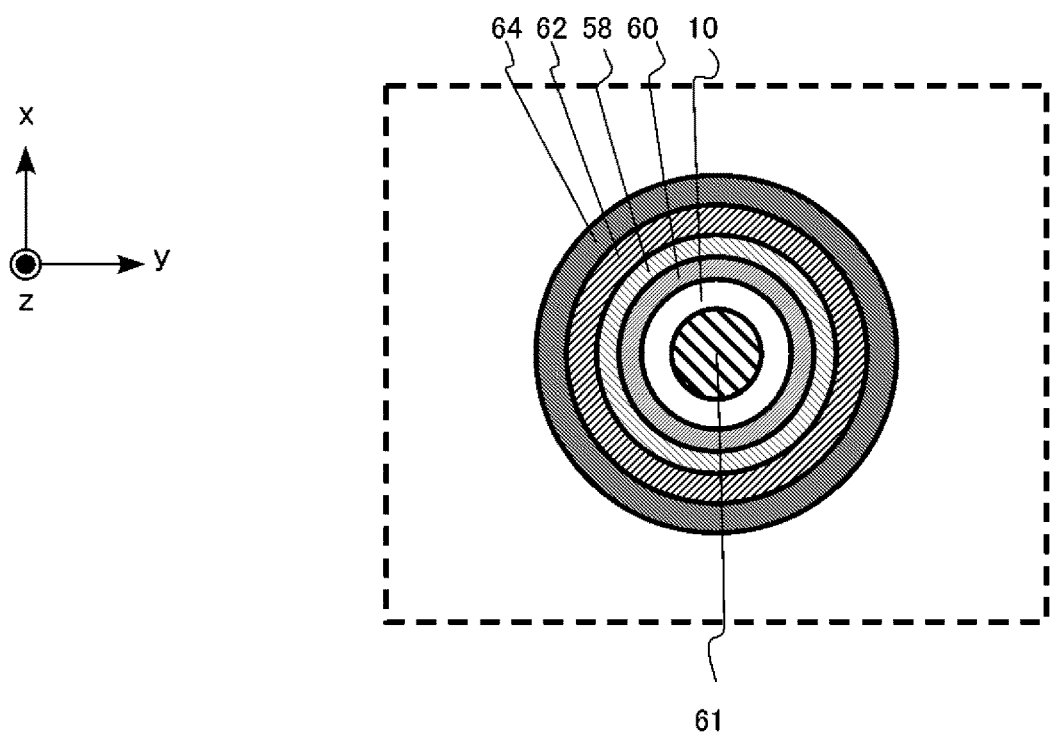

Next, a silicon oxide layer 64 is formed on the silicon nitride layer 62 (FIGS. 11A and 11B). The silicon oxide layer 64 is an example of the fourth layer.

The silicon oxide layer 64 is formed by, for example, thermally oxidizing a part of the silicon nitride layer 62. The silicon oxide layer 64 is the lower block insulating layer 20.

Figure 12A:
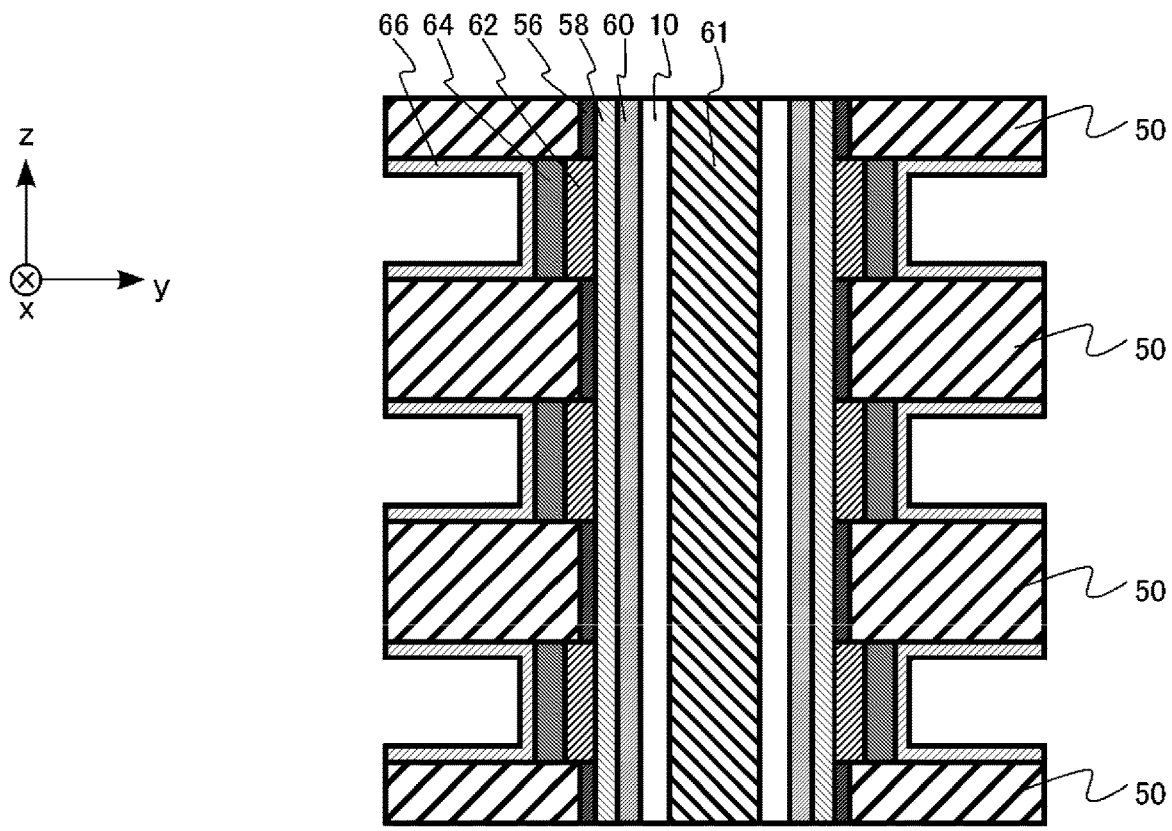
FIGS. 12A and 12B show schematic cross-sectional views showing the method of manufacturing the semiconductor storage device according to the first embodiment.
Figure 12B:
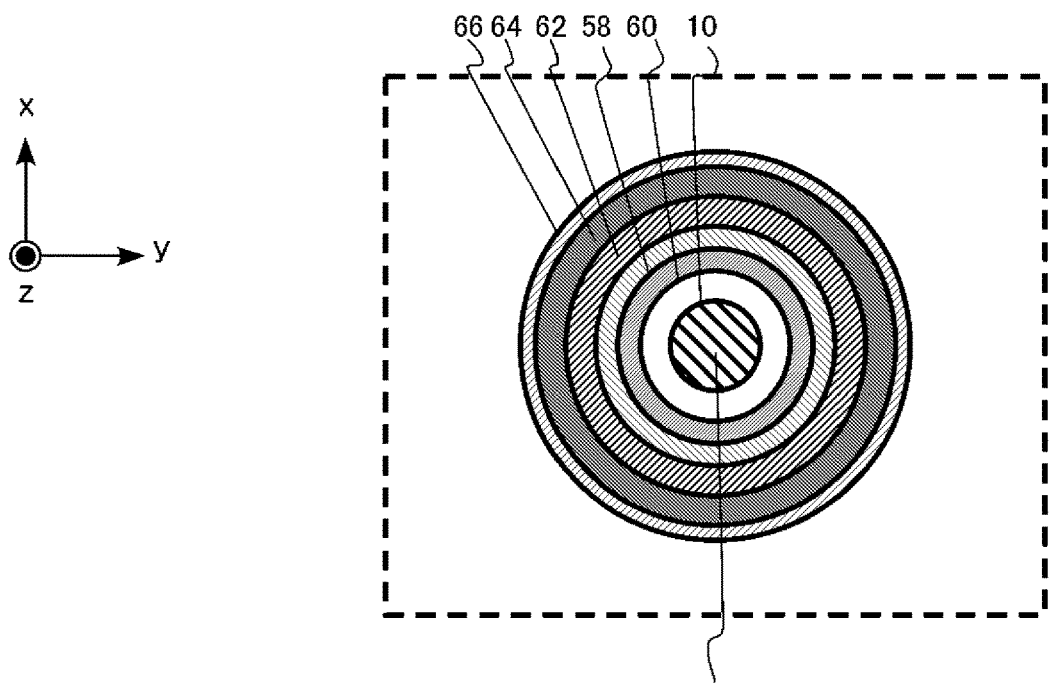

Next, an aluminum oxide layer 66 is formed on the silicon oxide layer 64 (FIGS. 12A and 12B). The aluminum oxide layer 66 is formed by, for example, a CVD method. The aluminum oxide layer 66 is the upper block insulating layers 22.

Figure 13A:
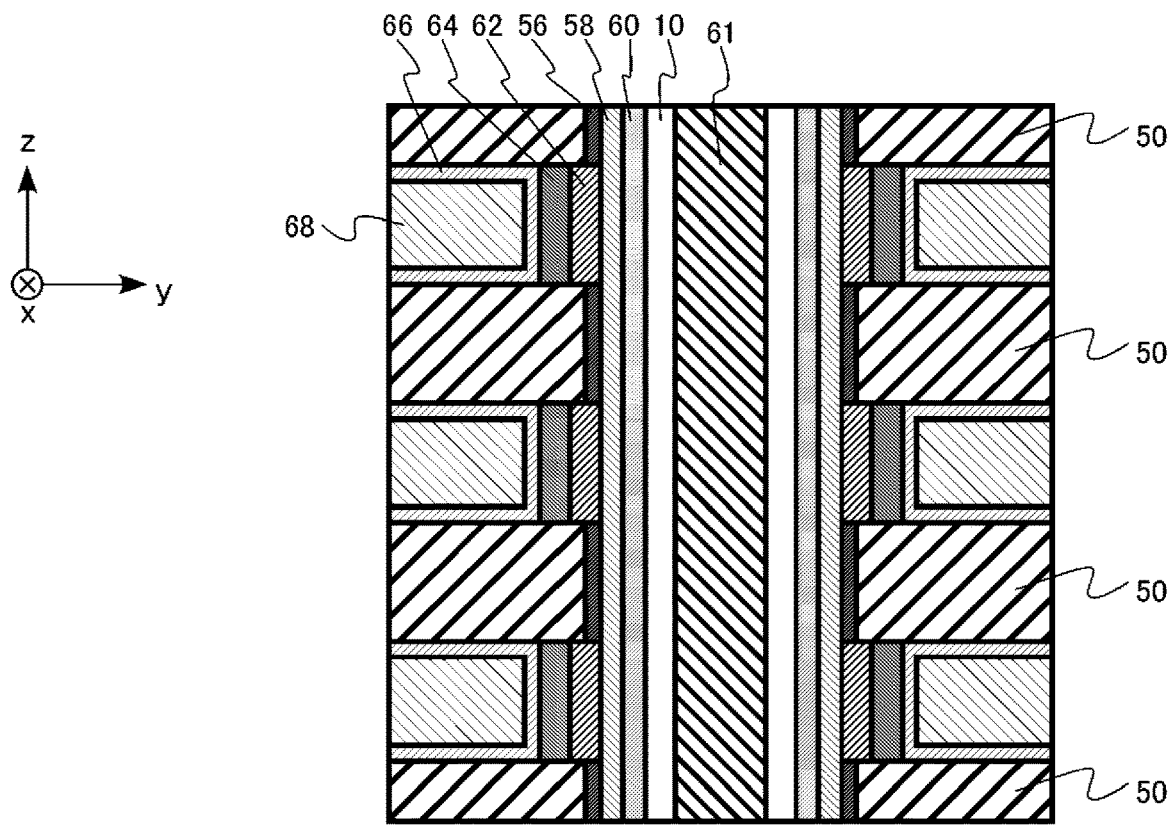
FIGS. 13A and 13B show schematic cross-sectional views showing the method of manufacturing the semiconductor storage device according to the first embodiment.
Figure 13B:
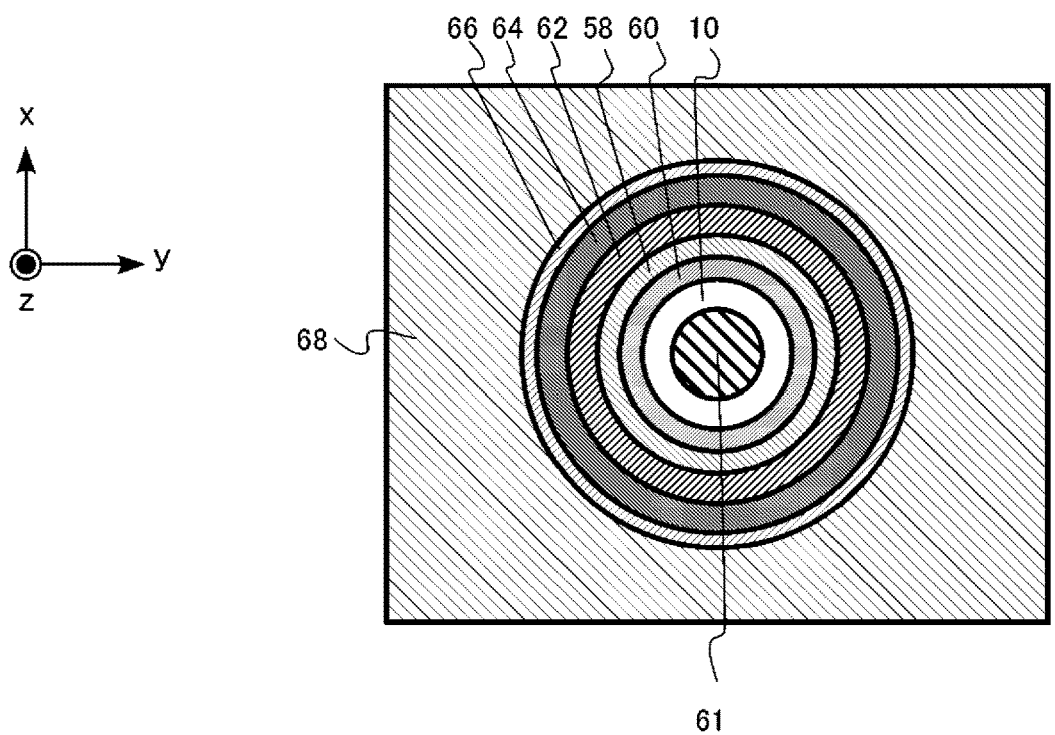

Next, a tungsten layer 68 is formed on the aluminum oxide layer 66 (FIGS. 13A and 13B). The tungsten layer 68 is an example of the metal layer. The tungsten layer 68 is formed by, for example, a CVD method.

The tungsten layer 68 finally becomes the word line WL. For example, a barrier metal film such as a titanium nitride film may be formed before the tungsten layer 68 is formed.

The memory cell array 100 of the semiconductor storage device according to the first embodiment is manufactured according to the manufacturing method described above.

Next, an operation and an effect of the semiconductor storage device according to the first embodiment will be described.

Figure 14:
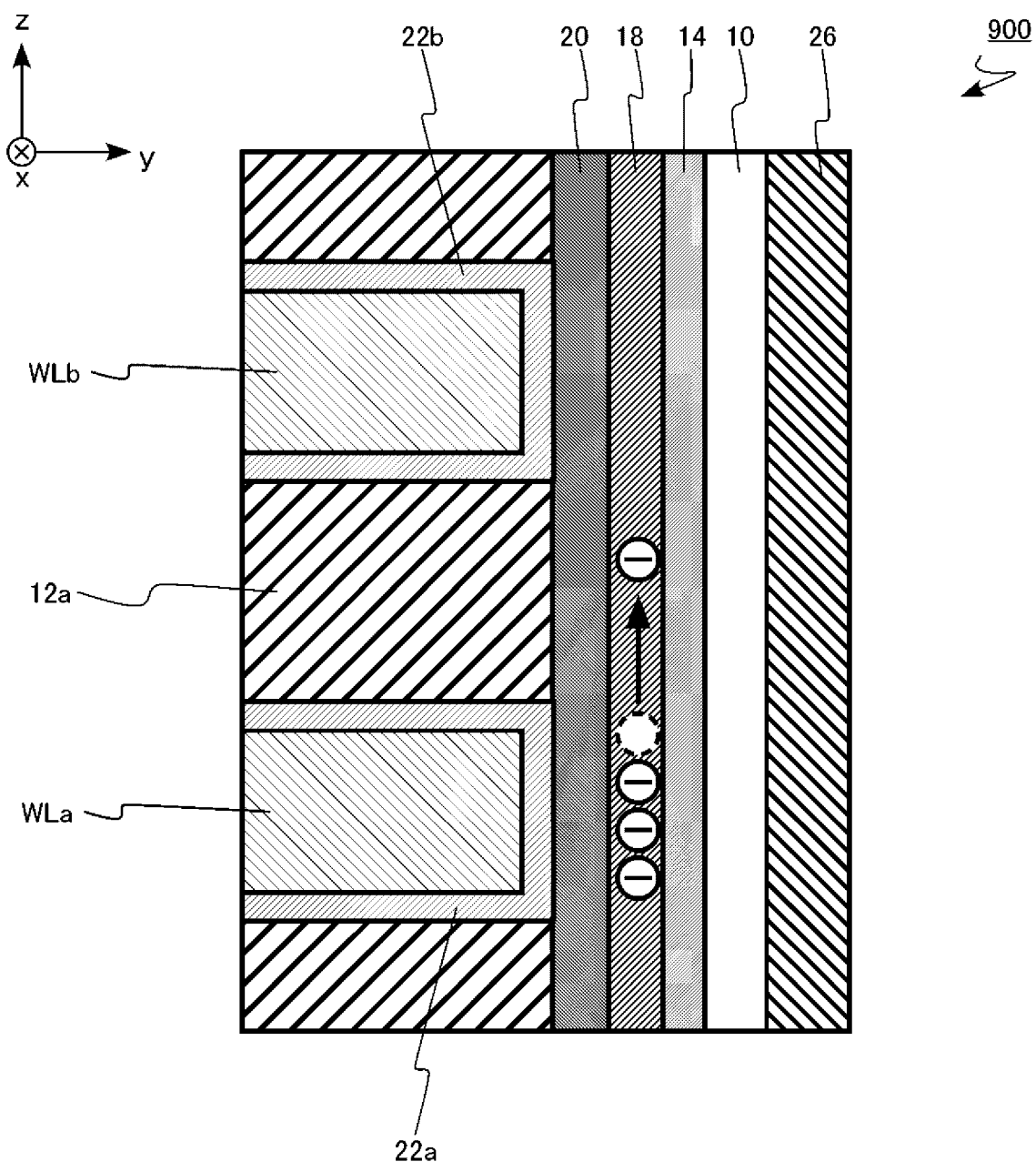
FIG. 14 is a diagram illustrating an operation and an effect of the semiconductor storage device according to the first embodiment.

FIG. 14 is a diagram illustrating the action and the effect of the semiconductor storage device according to the first embodiment. FIG. 14 is an enlarged schematic cross-sectional view of a memory cell array 900 of a semiconductor storage device according to a comparative example. FIG. 14 is a cross section corresponding to FIG. 3.

The memory cell array 900 of the comparative example is different from the memory cell array 100 of the first embodiment in that the charge storage layer 18 is not divided between the memory cells MCs and is continuous in the z direction.

In the memory cell array 900 of the comparative example, for example, as shown in FIG. 14, the charges stored in the charge storage layer 18 between the first word line WLa and the semiconductor layer 10 may move to an adjacent memory cell MC through the charge storage layer 18. A charge retention property may deteriorate due to the charges moving away from the charge storage layer 18. A data retention failure may occur due to the deterioration of the charge retention property.

In the memory cell array 100 of the first embodiment, two charge storage layers 18 of the memory cell MC adjacent to each other in the z direction are physically separated. Therefore, the charges do not move through the charge storage layer 18. Therefore, the charge retention property is improved and the data retention failure is reduced, according to some embodiments.

In the memory cell array 100 of the first embodiment, from a viewpoint of preventing a decrease in the threshold voltage of the memory cell transistor MT, it is preferable that the width (W1 in FIG. 3) of the charge storage layer 18 in the z direction (the first direction) is equal to or larger than the width (W2 in FIG. 3) of the word line WL in the z direction (the first direction). It is preferable that the width (W1 in FIG. 3) of the charge storage layer 18 in the z direction (the first direction) is larger than the width (W2 in FIG. 3) of the word line WL in the z direction (the first direction). When the width W1 of the charge storage layer 18 in the z direction is smaller than the width W2 of the word line WL in the z direction, the threshold voltage of the memory cell transistor MT may decrease due to a wrap-around of an electric field from an end of the word line WL.

In the memory cell array 100 of the first embodiment, from an viewpoint of improving the charge retention property, it is preferable that the atomic ratio (Si/N) of the silicon (Si) to the nitrogen (N) of the charge storage layer 18 is higher than the atomic ratio (Si/N) of the silicon (Si) to the nitrogen (N) of the intermediate insulating film 16.

Since the atomic ratio (Si/N) of the silicon (Si) to the nitrogen (N) of the charge storage layer 18 is high, a density of a trap level in the charge storage layer 18 is high. Therefore, an amount of the charges stored in the charge storage layer 18 is increased, and the charge retention property is improved according to some embodiments.

In addition, since the atomic ratio (Si/N) of the silicon (Si) to the nitrogen (N) of the intermediate insulating film 16 is low, a density of a trap level in the intermediate insulating film 16 is low. Therefore, the movement of the charges between the memory cells MCs via the trap level is prevented. Therefore, the charge retention property is improved according to some embodiments.

In the memory cell array 100 of the first embodiment, from the viewpoint of improving the charge retention property, it is preferable that the charge storage layer 18 includes a metal. Since the charge storage layer 18 includes a metal, a deep trap level is formed in the charge storage layer 18. Therefore, charges trapped in the charge storage layer 18 are less likely to escape from the charge storage layer 18. Therefore, the charge retention property is improved according to some embodiments.

In addition, in the memory cell array 100 of the first embodiment, from the viewpoint of improving the charge retention property, it is preferable that the charge storage layer 18 includes boron (B), phosphorus (P), or germanium (Ge). Since the charge storage layer 18 includes boron (B), phosphorus (P), or germanium (Ge), the deep trap level is formed in the charge storage layer 18. Therefore, the charges trapped in the charge storage layer 18 are less likely to escape from the charge storage layer 18. Therefore, the charge retention property is improved according to some embodiments.

As described above, the semiconductor storage device capable of improving the charge retention property can be provided according to the first embodiment.

Second Embodiment

A semiconductor storage device of a second embodiment is different from the semiconductor storage device of the first embodiment in that the word lines of the memory cell array are divided in an xy plane and one source select transistor SST and one drain select transistor SDT are shared by two memory strings MSs. Hereinafter, a part of descriptions of contacts overlapping with that of the first embodiment will be omitted.

The semiconductor storage device according to the second embodiment is a three-dimensional NAND flash memory. A memory cell of the semiconductor storage device according to the second embodiment is a so-called MONOS memory cell.

Figure 15:
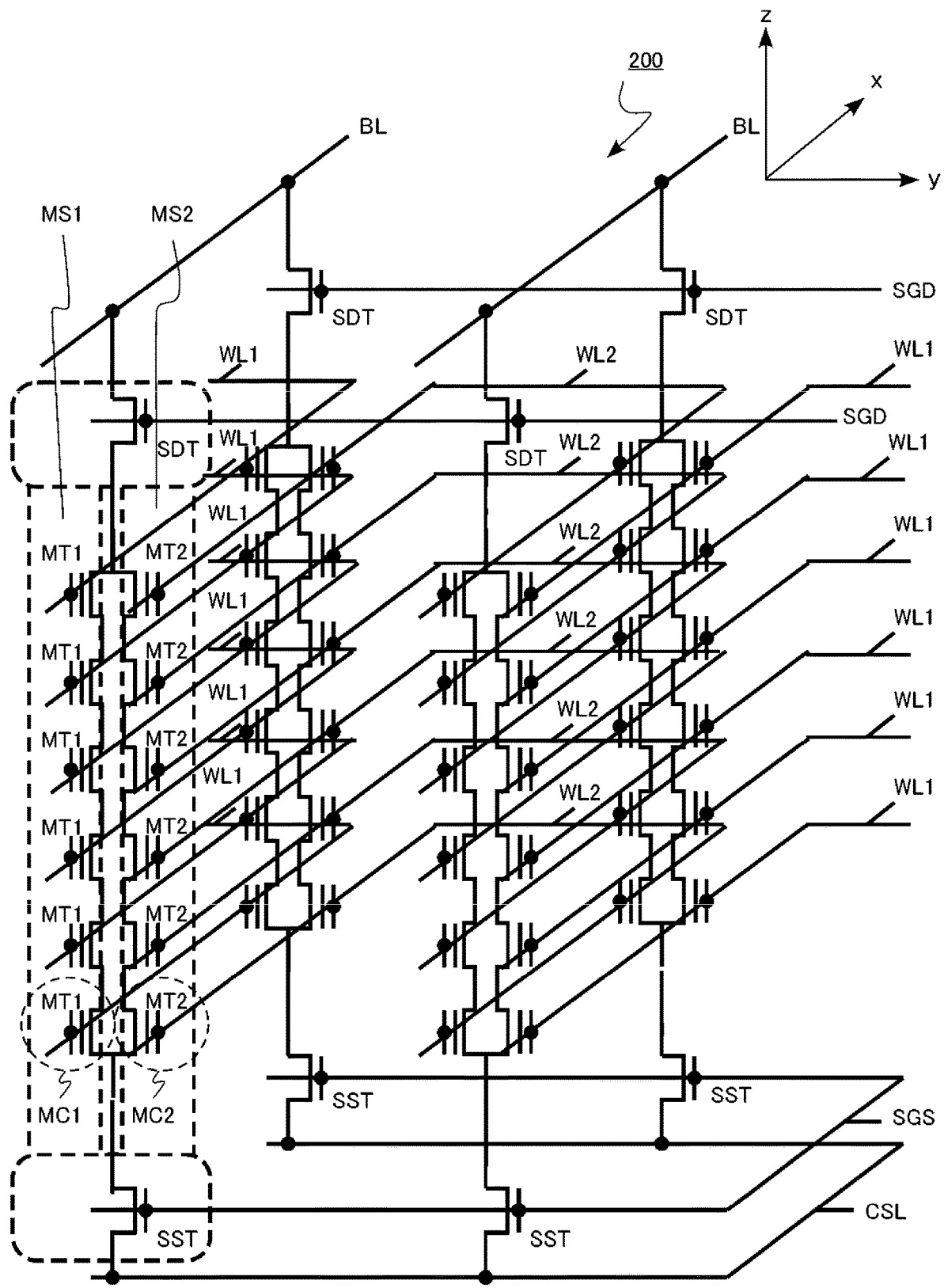
FIG. 15 is a circuit diagram of a memory cell array of a semiconductor storage device according to a second embodiment.

FIG. 15 is a circuit diagram of a memory cell array 200 of the semiconductor storage device according to the second embodiment.

The memory cell array 200 of the three-dimensional NAND flash memory according to the second embodiment may include a plurality of word lines WLs, a common source line CSL, a source select gate line SGS, a plurality of drain select gate lines SGDs, a plurality of bit lines BLs, and a plurality of memory strings MSs, as shown in FIG. 15.

The plurality of word lines WLs are arranged apart from one another in the z direction. The plurality of word lines WLs are stacked and arranged in the z direction. The word line WL is divided into a word line WL1 and a word line WL2 on the same xy plane. The word lines WL1 and WL2 extend in the x direction, for example.

The plurality of memory strings MSs extend in the z direction. The plurality of bit lines BLs extend in the x direction, for example. Two memory strings MSs, that is, a first memory string MS1 and a second memory string MS2 share one source select transistor SST and one drain select transistor SDT.

Hereinafter, the x direction is defined as the second direction, the y direction is defined as the third direction, and the z direction is defined as the first direction. The x direction, the y direction, and the z direction are, for example, perpendicular to one another.

As shown in FIG. 15, the first memory string MS1 includes a source select transistor SST, a plurality of memory cell transistors MT's, and a drain select transistor SDT that were connected in series between the common source line CSL and the bit line BL. In addition, the second memory string MS2 includes the source select transistor SST, a plurality of memory cell transistors MT2s, and the drain select transistor SDT that were connected in series between the common source line CSL and the bit line BL.

By selecting one bit line BL and one drain select gate line SGD, the first memory string MS1 and the second memory string MS2 are selected. Then, by selecting one word line WL1, one memory cell MC1 belonging to the first memory string MS1 is selected. In addition, by selecting one word line WL2, one memory cell MC2 belonging to the second memory string MS2 is selected.

According to the three-dimensional NAND flash memory of the second embodiment, two memory strings MSs share one source select transistor SST and one drain select transistor SDT. Therefore, the memory cells can be arranged at a high density.

Figure 16A:
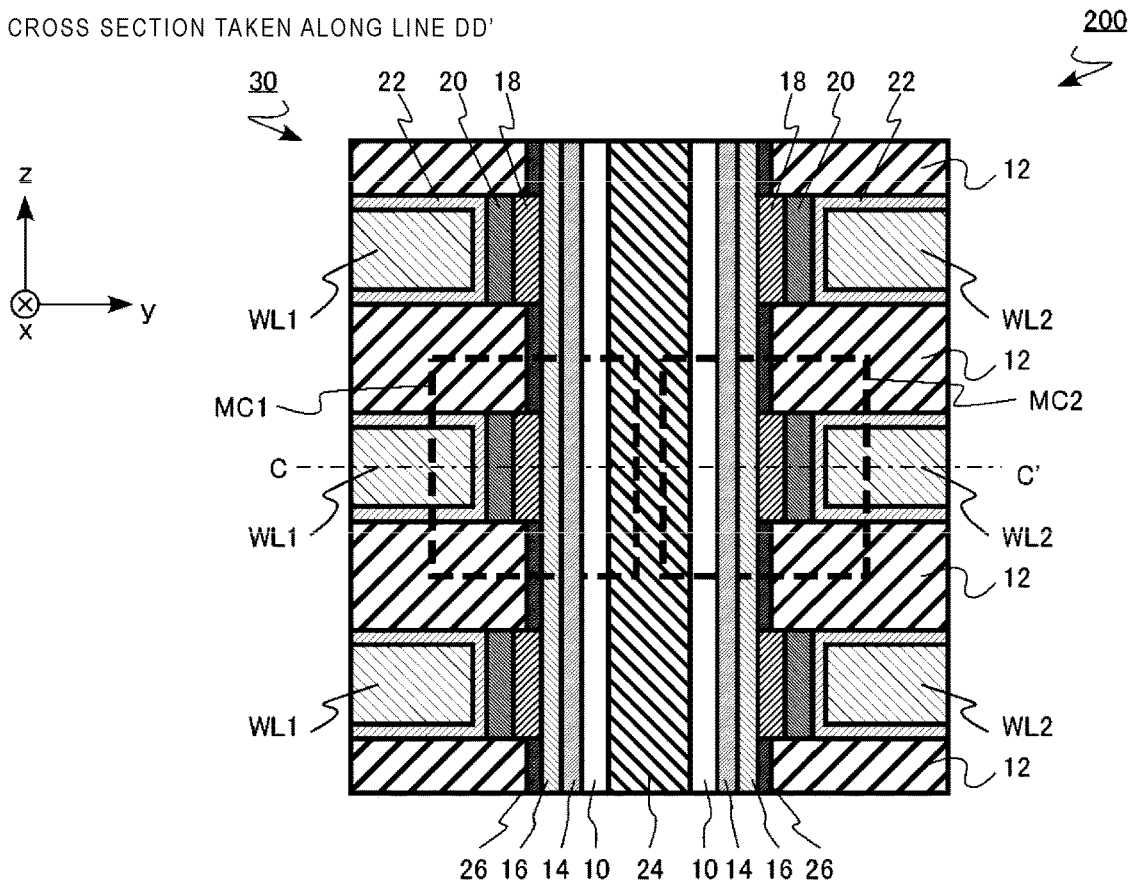
FIGS. 16A and 16B show schematic cross-sectional views of a memory cell array of the semiconductor storage device according to the second embodiment.
Figure 16B:
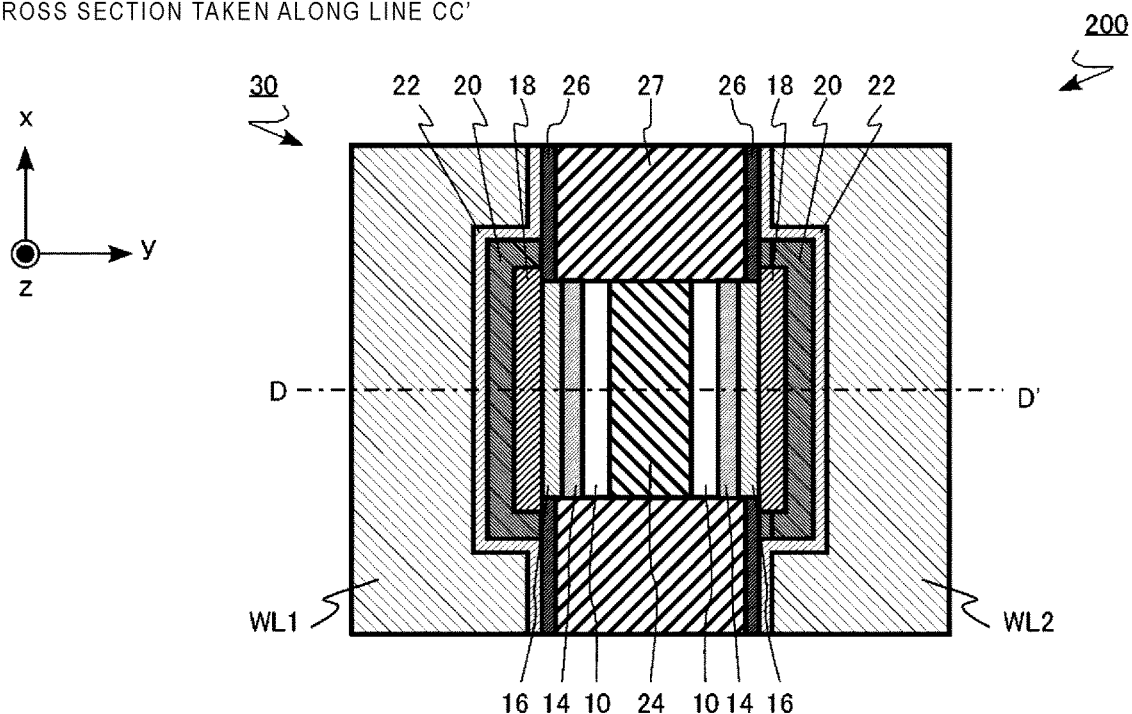

FIGS. 16A and 16B show schematic cross-sectional views showing the memory cell array 200 of the semiconductor storage device according to the second embodiment. FIGS. 16A and 16B show cross sections of a plurality of memory cells MC1s and a plurality of memory cells MC2s in, for example, the two memory strings MSs, that is, the first memory string MS1 and the second memory string MS2, surrounded by the dotted lines in the memory cell array 200 of FIG. 15.

FIG. 16A is a cross-sectional view of the memory cell array 200 in a yz plane. FIG. 16A is a cross section of FIG. 16B taken along a line DD'. FIG. 16B is a cross-sectional view of the memory cell array 200 in an xy plane. FIG. 16B is a cross section of FIG. 16A taken along a line CC'. In FIG. 16A, regions surrounded by the broken line are the memory cell MC1 and the memory cell MC2.

As shown in FIGS. 16A and 16B, the memory cell array 200 may include a plurality of word lines WL1s, a plurality of word lines WL2s, the semiconductor layer 10, the plurality of interlayer insulating layers 12, the tunnel insulating film 14, the intermediate insulating film 16, the plurality of charge storage layers 18, the plurality of lower block insulating layers 20, the plurality of upper block insulating layers 22, the core insulating layer 24, the cover insulating film 26 and an isolation insulating layer 27. The plurality of word lines WLs and the plurality of interlayer insulating layers 12 form the stacked body 30.

The interlayer insulating layer 12 is an example of the insulating layer. The word lines WL1 and WL2 are examples of the gate electrode layer. The tunnel insulating film 14 is an example of the first insulating film. The intermediate insulating film 16 is an example of the second insulating film.

The memory cell array 200 is provided, for example, on a semiconductor substrate (not shown). The semiconductor substrate has a surface parallel to the x direction and the y direction.

The word lines WL1 and WL2 and the interlayer insulating layers 12 are alternately stacked in the z direction (the first direction) on the semiconductor substrate. The word line WL1 functions as a control electrode of the memory cell transistor MT1. The word line WL2 functions as a control electrode of the memory cell transistor MT2.

The semiconductor layer 10 is provided in the stacked body 30. The semiconductor layer 10 extends in the z direction. The semiconductor layer 10 functions as a channel of the memory cell transistors MT1 and MT2.

The tunnel insulating film 14 is provided between the semiconductor layer 10 and the word lines WL1 and WL2. The tunnel insulating film 14 is provided between the semiconductor layer 10 and the intermediate insulating film 16.

The intermediate insulating film 16 is provided between the tunnel insulating film 14 and the charge storage layer 18. The intermediate insulating film 16 is provided between the tunnel insulating film 14 and the interlayer insulating layer 12. The intermediate insulating film 16 is in contact with the charge storage layer 18.

The intermediate insulating film 16 includes silicon (Si) and nitrogen (N). The intermediate insulating film 16 includes, for example, silicon nitride. The intermediate insulating film 16 is, for example, a silicon nitride film.

The intermediate insulating film 16 includes, for example, silicon (Si), nitrogen (N), and oxygen (O). The intermediate insulating film 16 includes, for example, silicon oxynitride.

The intermediate insulating film 16 includes a chemical composition different from that of the charge storage layer 18.

The charge storage layer 18 is provided between the tunnel insulating film 14 and the word line WL1. The charge storage layer 18 is provided between the tunnel insulating film 14 and the word line WL2. The plurality of charge storage layers 18 are separated from one another. The interlayer insulating layer 12 is sandwiched between two charge storage layers 18 adjacent to each other in the z direction.

The charge storage layer 18 includes silicon (Si) and nitrogen (N). The charge storage layer 18 includes, for example, silicon nitride. The charge storage layer 18 is, for example, a silicon nitride layer.

The charge storage layer 18 includes, for example, silicon (Si), nitrogen (N), and oxygen (O). The charge storage layer 18 includes, for example, silicon oxynitride.

The atomic ratio (Si/N) of the silicon (Si) to the nitrogen (N) of the charge storage layer 18 is higher than the atomic ratio (Si/N) of the silicon (Si) to the nitrogen (N) of the intermediate insulating film 16, for example.

The charge storage layer 18 includes, for example, a metal. The charge storage layer 18 includes, for example, at least one of aluminum (Al) or titanium (Ti).

The charge storage layer 18 includes, for example, at least one of boron (B), phosphorus (P), or germanium (Ge).

The lower block insulating layer 20 is provided between the charge storage layer 18 and the word line WL1. The lower block insulating layer 20 is provided between the charge storage layer 18 and the word line WL2. The lower block insulating layer 20 is provided between the charge storage layer 18 and the upper block insulating layer 22. The lower block insulating layer 20 is in contact with the interlayer insulating layer 12 in the z direction.

The lower block insulating layer 20 includes, for example, silicon oxide. The lower block insulating layer 20 is, for example, a silicon oxide layer.

The upper block insulating layer 22 is provided between the charge storage layer 18 and the word line WL1. The upper block insulating layer 22 is provided between the charge storage layer 18 and the word line WL2. The upper block insulating layer 22 is provided between the lower block insulating layer 20 and the word line WL1. The upper block insulating layer 22 is provided between the lower block insulating layer 20 and the word line WL2. The upper block insulating layer 22 is in contact with the interlayer insulating layer 12 in the z direction.

The upper block insulating layer 22 includes, for example, aluminum oxide. The upper block insulating layer 22 is, for example, an aluminum oxide layer.

The core insulating layer 24 is provided in the stacked body 30. The core insulating layer 24 extends in the z direction.

The cover insulating film 26 is provided between the intermediate insulating film 16 and the interlayer insulating layer 12. The cover insulating film 26 is in contact with the intermediate insulating film 16 and the interlayer insulating layer 12.

The isolation insulating layer 27 is provided between the word line WL1 and the word line WL2. The isolation insulating layer 27 has a function of electrically separating the word line WL1 from the word line WL2. Further, the isolation insulating layer 27 has a function of isolating semiconductor layers 10 that are adjacent to each other in the x direction.

The isolation insulating layer 27 is, for example, an oxide, an oxynitride, or a nitride. The isolation insulating layer 27 includes, for example, silicon oxide. The isolation insulating layer 27 is, for example, a silicon oxide layer.

Figure 17:
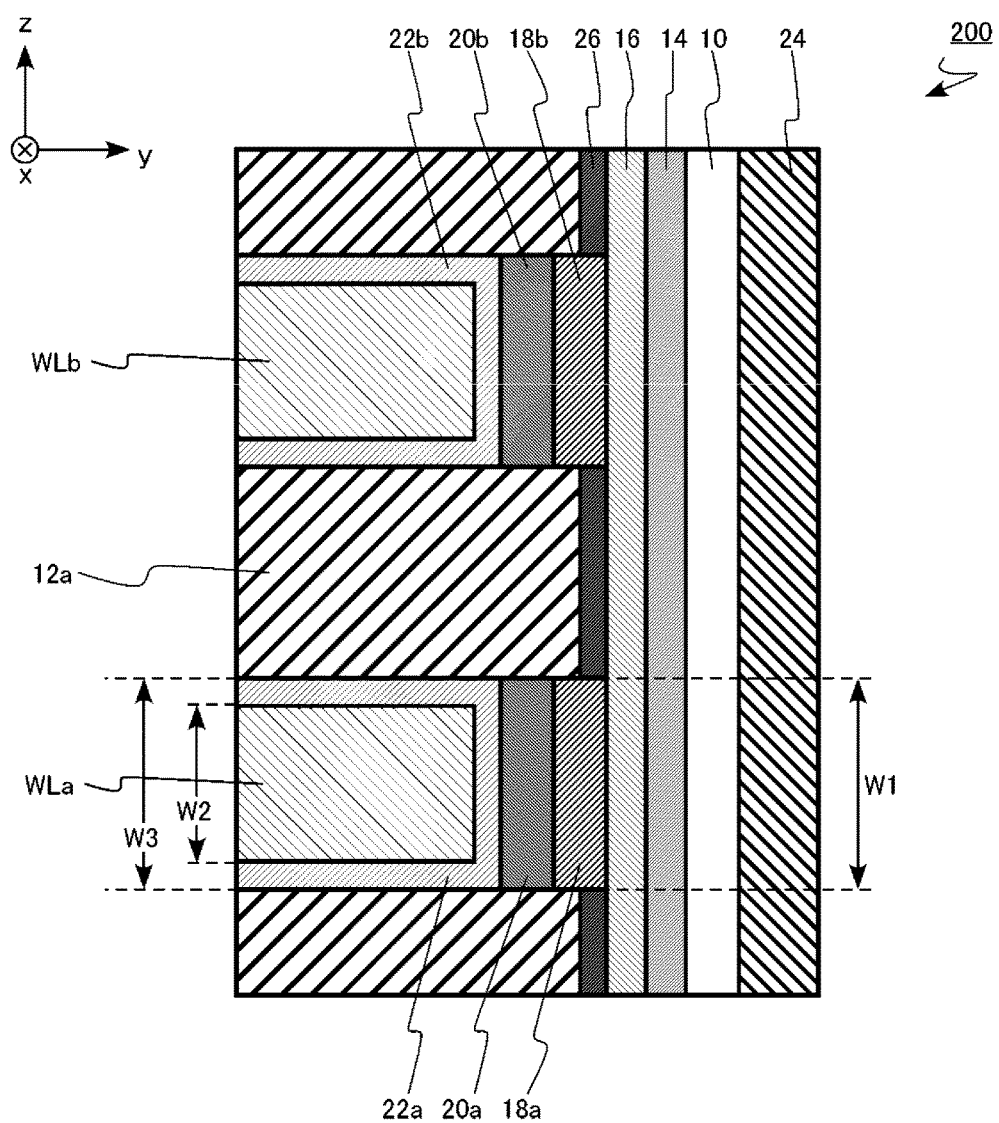
FIG. 17 is an enlarged schematic cross-sectional view of the memory cell array of the semiconductor storage device according to the second embodiment.

FIG. 17 is an enlarged schematic cross-sectional view of the memory cell array 200 of the semiconductor storage device according to the second embodiment. FIG. 17 is a partially enlarged view of FIG. 16A.

The memory cell array 200 may include the first word line WLa, the second word line WLb, the semiconductor layer 10, the first interlayer insulating layer 12a, the tunnel insulating film 14, the intermediate insulating film 16, the first charge storage layer 18a, the second charge storage layer 18b, the first lower block insulating layer 20a, the second lower block insulating layer 20b, the first upper block insulating layer 22a, the second upper block insulating layer 22b, the core insulating layer 24, and the cover insulating film 26.

Each of the first word line WLa and the second word line WLb is one of the plurality of word lines WL1s. The first word line WLa is an example of the first gate electrode layer. The second word line WLb is an example of the second gate electrode layer.

The first interlayer insulating layer 12a is one of the plurality of interlayer insulating layers 12. The first interlayer insulating layer 12a is an example of the first insulating layer.

Each of the first charge storage layer 18a and the second charge storage layer 18b is one of the plurality of charge storage layers 18.

Each of the first lower block insulating layer 20a and the second lower block insulating layer 20b is one of the plurality of lower block insulating layers 20. The first lower block insulating layer 20a is an example of the first portion of the second insulating layer.

Each of the first upper block insulating layer 22a and the second upper block insulating layer 22b is one of the plurality of upper block insulating layers 22. The first upper block insulating layer 22a is an example of the second portion of the second insulating layer.

A configuration shown in FIG. 17 is similar to the configuration shown in FIG. 3 of the first embodiment, so that a description thereof will be omitted.

Next, an example of a method of manufacturing the semiconductor storage device according to the second embodiment will be described. Hereinafter, an example of a method of manufacturing the memory cell array 200 of the semiconductor storage device according to the second embodiment will be described.

FIGS. 18A and 18B, FIGS. 19A and 19B, FIGS. 20A and 20B, FIGS. 21A and 21B, FIGS. 22A and 22B, FIGS. 23A and 23B, FIGS. 24A and 24B, FIGS. 25A and 25B, FIGS. 26A and 26B, FIGS. 27A and 27B, FIGS. 28A and 28B and FIGS. 29A and 29B show schematic cross-sectional views showing the method of manufacturing the semiconductor storage device according to the second embodiment. FIGS. 18A and 18B, FIGS. 19A and 19B, FIGS. 20A and 20B, FIGS. 21A and 21B, FIGS. 22A and 22B, FIGS. 23A and 23B, FIGS. 24A and 24B, FIGS. 25A and 25B, FIGS. 26A and 26B, FIGS. 27A and 27B, FIGS. 28A and 28B and FIGS. 29A and 29B show cross sections corresponding to FIGS. 16A and 16B, respectively.

Figure 18A:
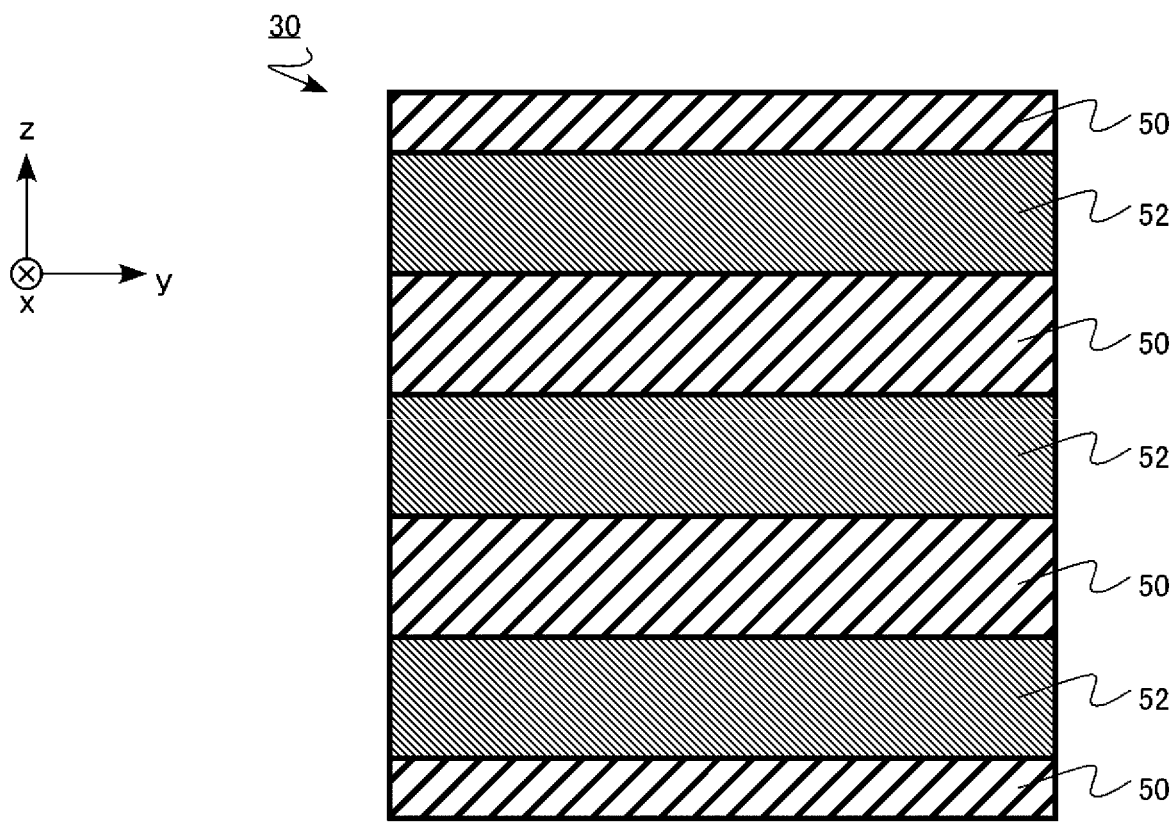
FIGS. 18A and 18B show schematic cross-sectional views showing a method of manufacturing the semiconductor storage device according to the second embodiment.
Figure 18B:
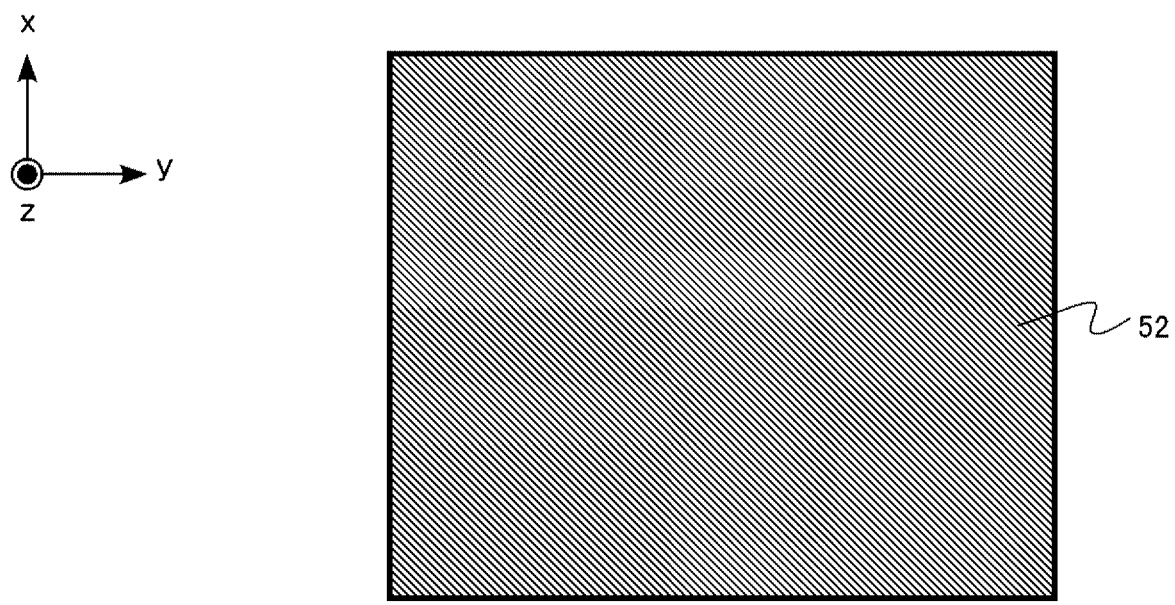

First, the silicon oxide layer 50 and the silicon nitride layer 52 are alternately stacked on the semiconductor substrate (not shown) (FIGS. 18A and 18B). The stacked body 30 in which the plurality of silicon oxide layers 50 and the plurality of silicon nitride layers 52 were alternately stacked in the z direction (the first direction) is formed. The silicon oxide layer 50 is an example of the first layer. The silicon nitride layer 52 is an example of the second layer.

The silicon oxide layer 50 and the silicon nitride layer 52 are formed by, for example, a CVD method. A part of the silicon oxide layer 50 is finally manufactured into the interlayer insulating layer 12.

Figure 19A:
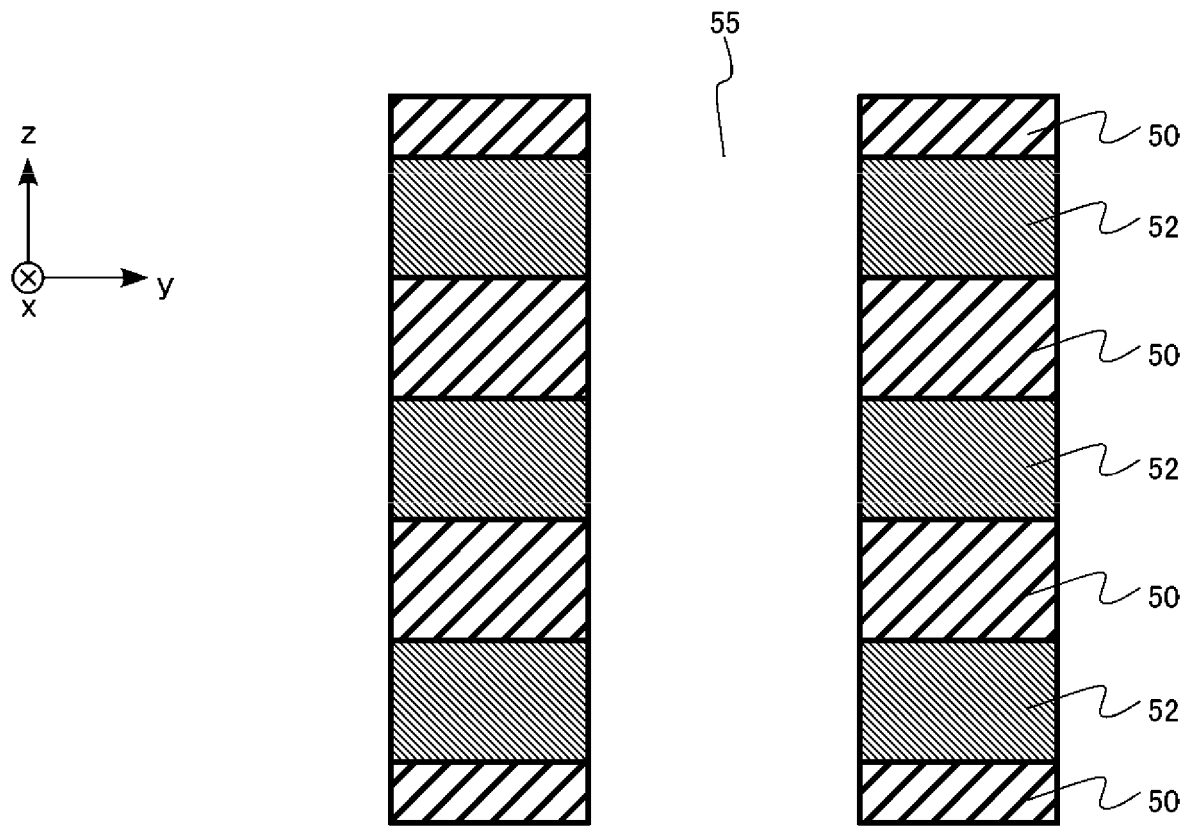
FIGS. 19A and 19B show schematic cross-sectional views showing the method of manufacturing the semiconductor storage device according to the second embodiment.
Figure 19B:
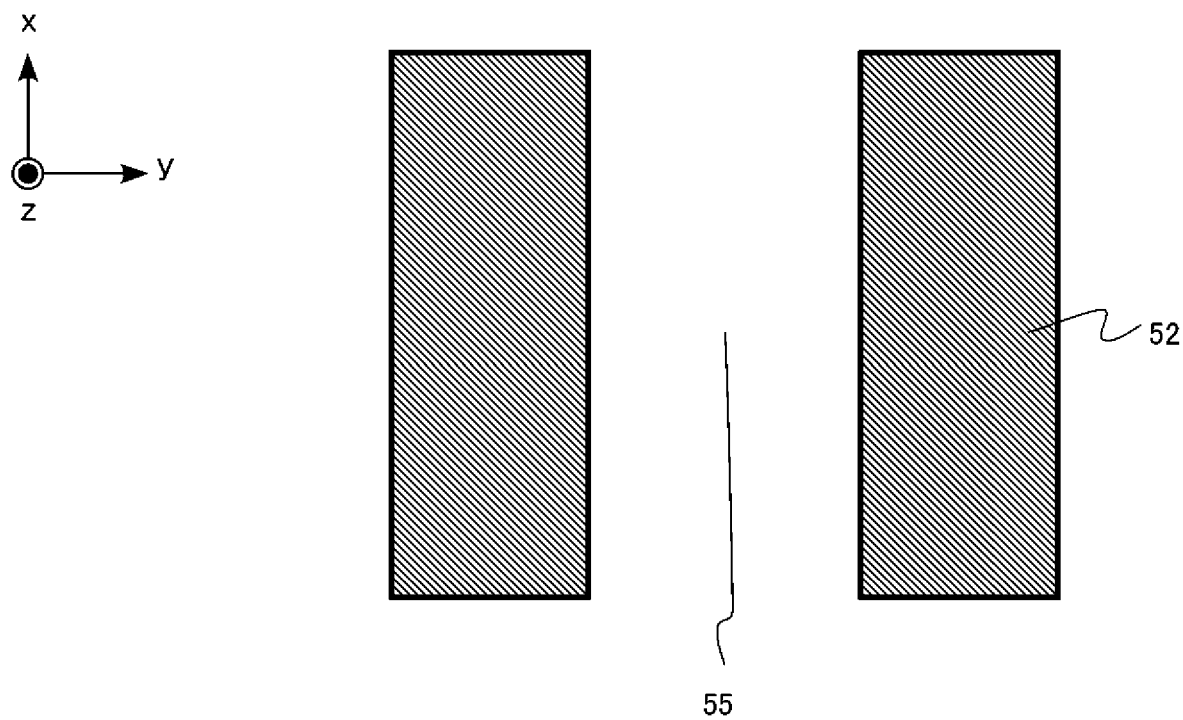

Next, a memory trench 55 is formed in the silicon oxide layers 50 and the silicon nitride layers 52 (FIGS. 19A and 19B). The memory trench 55 passes through the silicon oxide layers 50 and the silicon nitride layers 52 and extends in the x direction and the z direction. The memory trench 55 is formed by, for example, the lithography method and the RIE method.

Figure 20A:
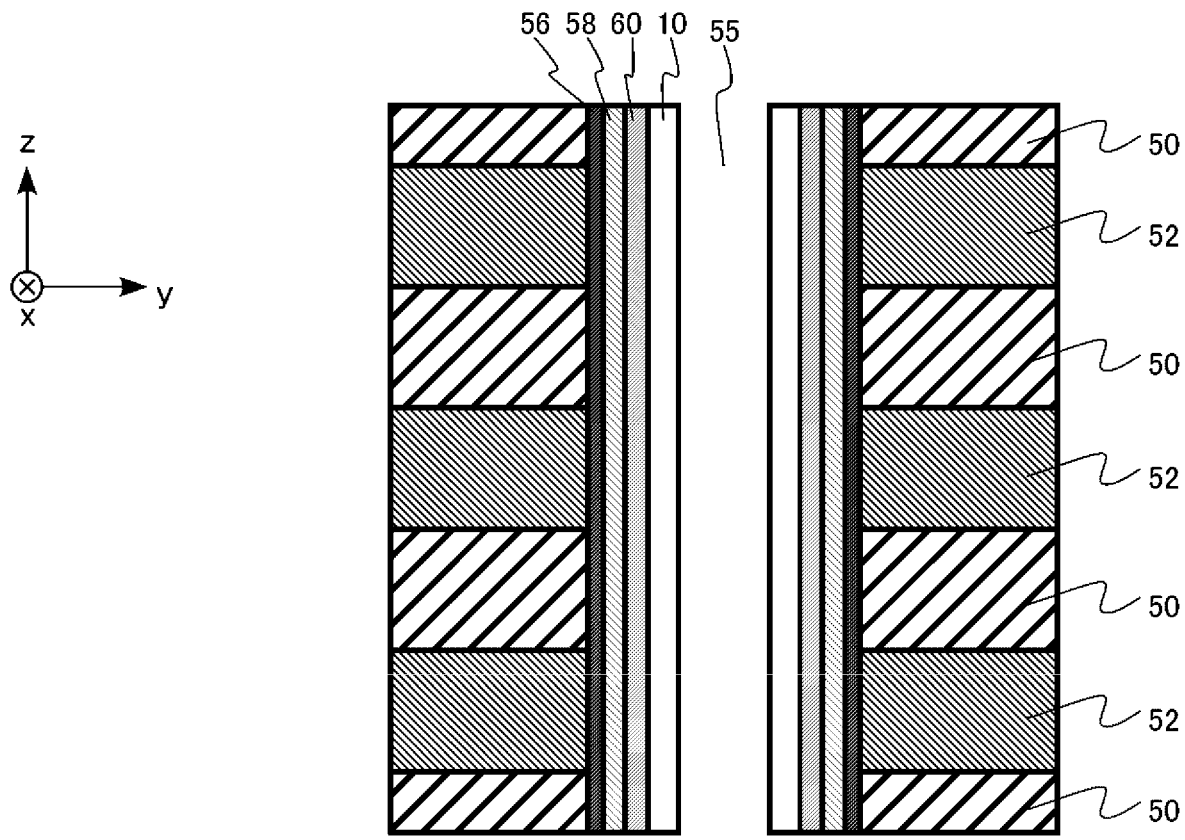
FIGS. 20A and 20B show schematic cross-sectional views showing the method of manufacturing the semiconductor storage device according to the second embodiment.
Figure 20B:
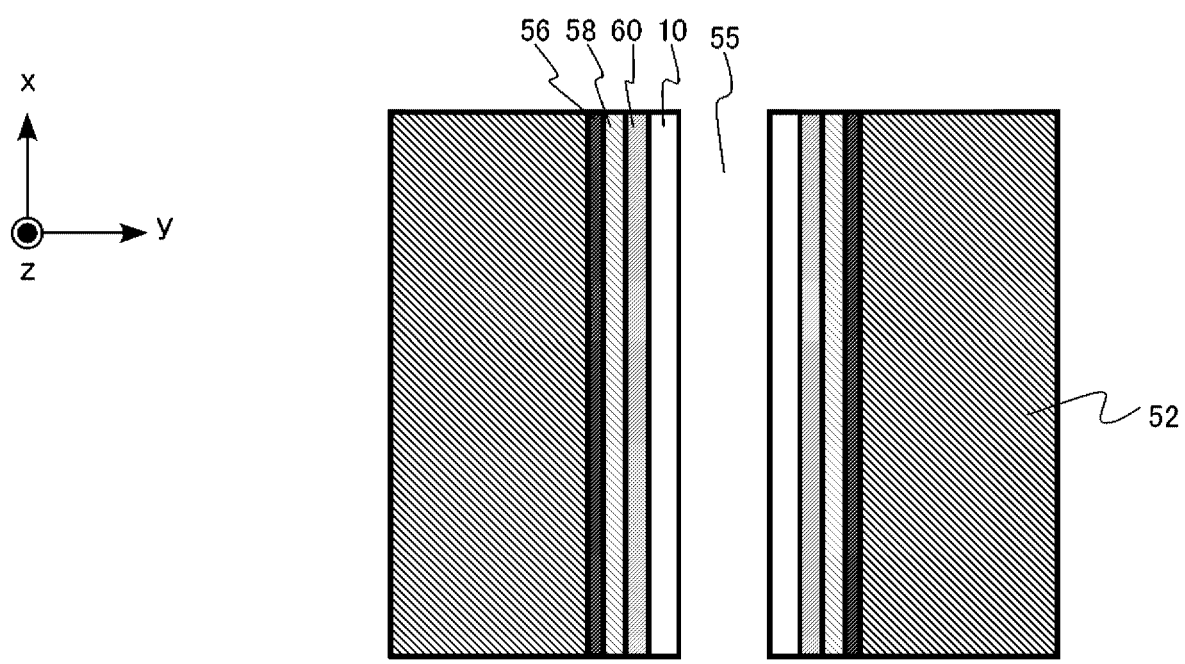

Next, the silicon oxide film 56, the silicon nitride film 58, the silicon oxide film 60, and the semiconductor layer 10 are formed on an inner wall of the memory trench 55 (FIGS. 20A and 20B). The silicon oxide film 56 is an example of the first film. The silicon nitride film 58 is an example of the second film. The silicon oxide film 60 is an example of the third film.

The silicon nitride film 58 is formed on the silicon oxide film 56. The silicon oxide film 60 is formed on the silicon nitride film 58. The semiconductor layer 10 is formed on the silicon oxide film 60. The semiconductor layer 10 is, for example, a polycrystalline silicon layer. The silicon oxide film 56, the silicon nitride film 58, the silicon oxide film 60, and the semiconductor layer 10 are formed by, for example, a CVD method.

The silicon oxide film 56 is the cover insulating film 26. The silicon nitride film 58 is the intermediate insulating film 16. The silicon oxide film 60 is the tunnel insulating film 14.

Figure 21A:
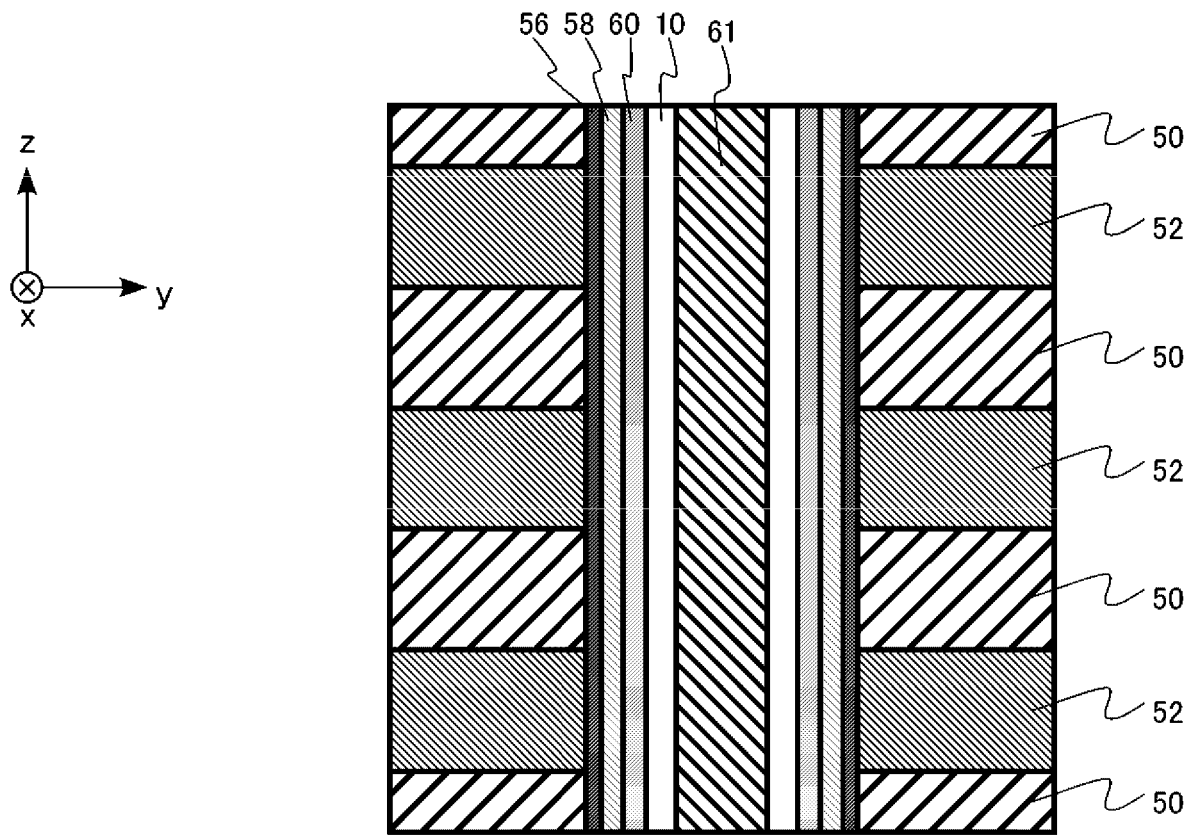
FIGS. 21A and 21B show schematic cross-sectional views showing the method of manufacturing the semiconductor storage device according to the second embodiment.
Figure 21B:
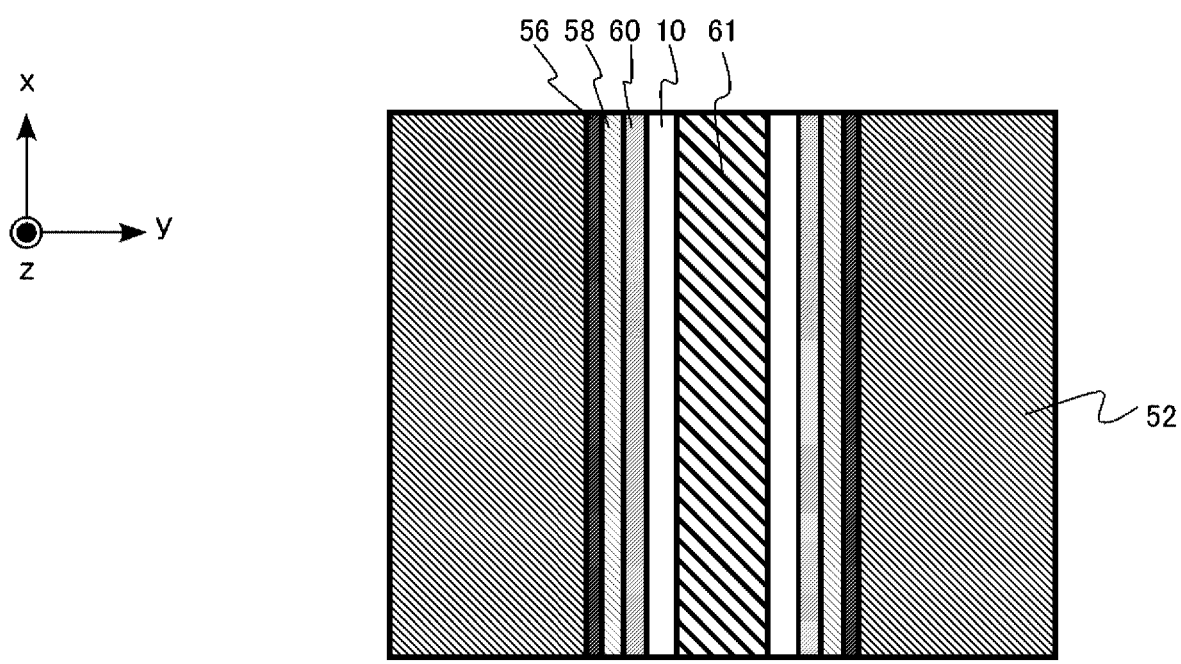

Next, the memory trench 55 is filled with the silicon oxide layer 61 (FIGS. 21A and 21B). The silicon oxide layer 61 is the core insulating layer 24.

Figure 22A:
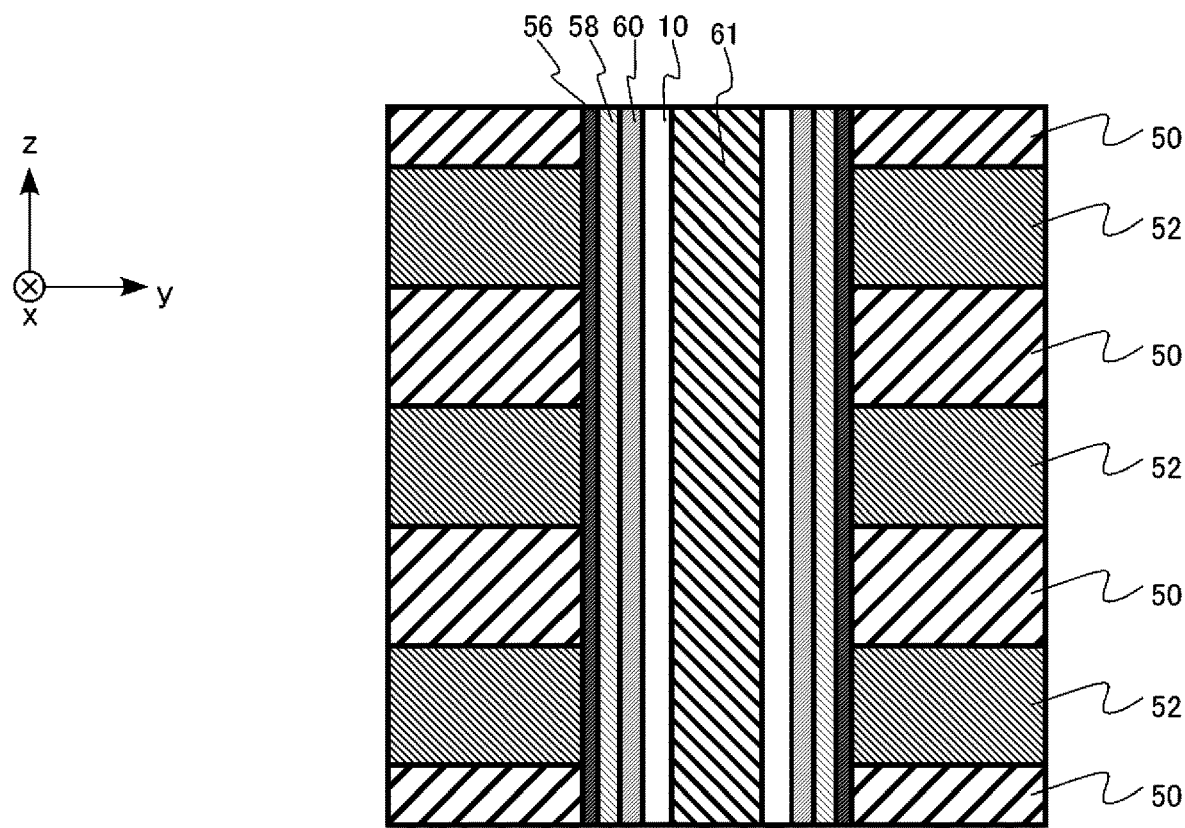
FIGS. 22A and 22B show schematic cross-sectional views showing the method of manufacturing the semiconductor storage device according to the second embodiment.
Figure 22B:
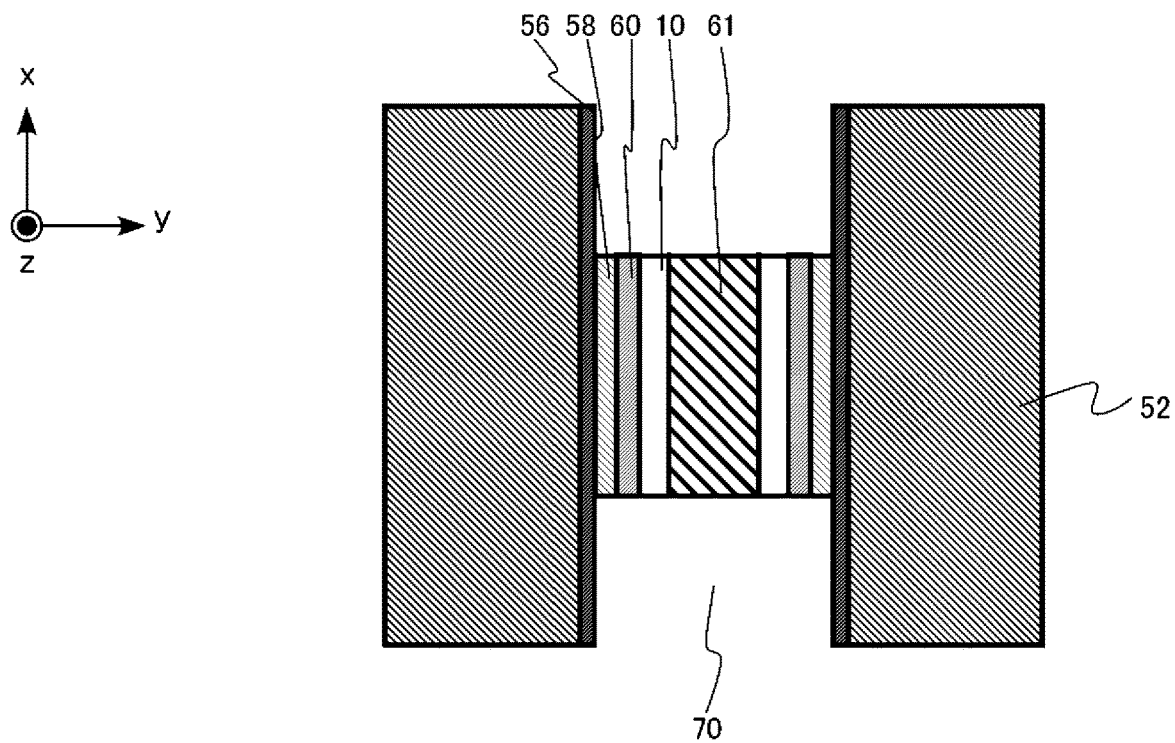

Next, the silicon nitride film 58, the silicon oxide film 60, the semiconductor layer 10, and the silicon oxide layer 61 are each partially removed to form an isolation hole 70 (FIGS. 22A and 22B). The isolation hole 70 extends in the z direction. The silicon nitride film 58, the silicon oxide film 60, the semiconductor layer 10, and the silicon oxide layer 61 are removed by, for example, the dry etching or the wet etching.

Figure 23A:
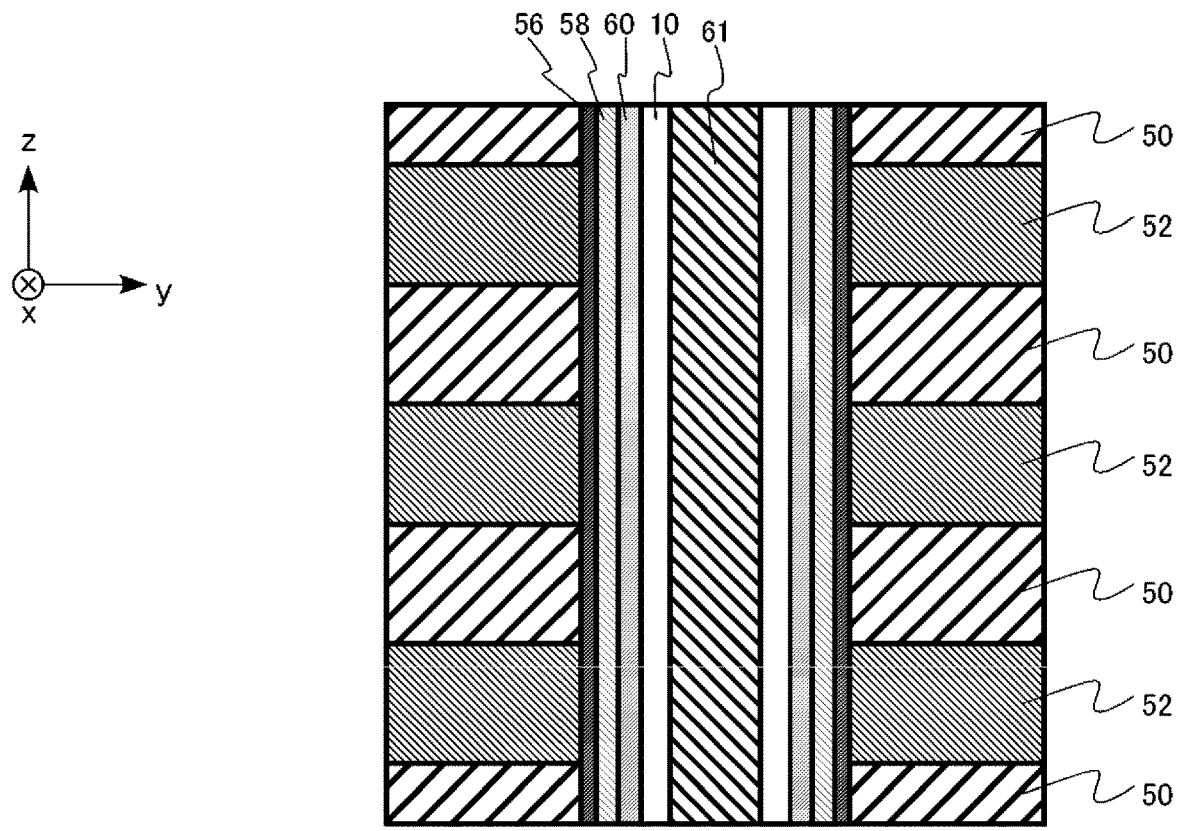
FIGS. 23A and 23B show schematic cross-sectional views showing the method of manufacturing the semiconductor storage device according to the second embodiment.
Figure 23B:
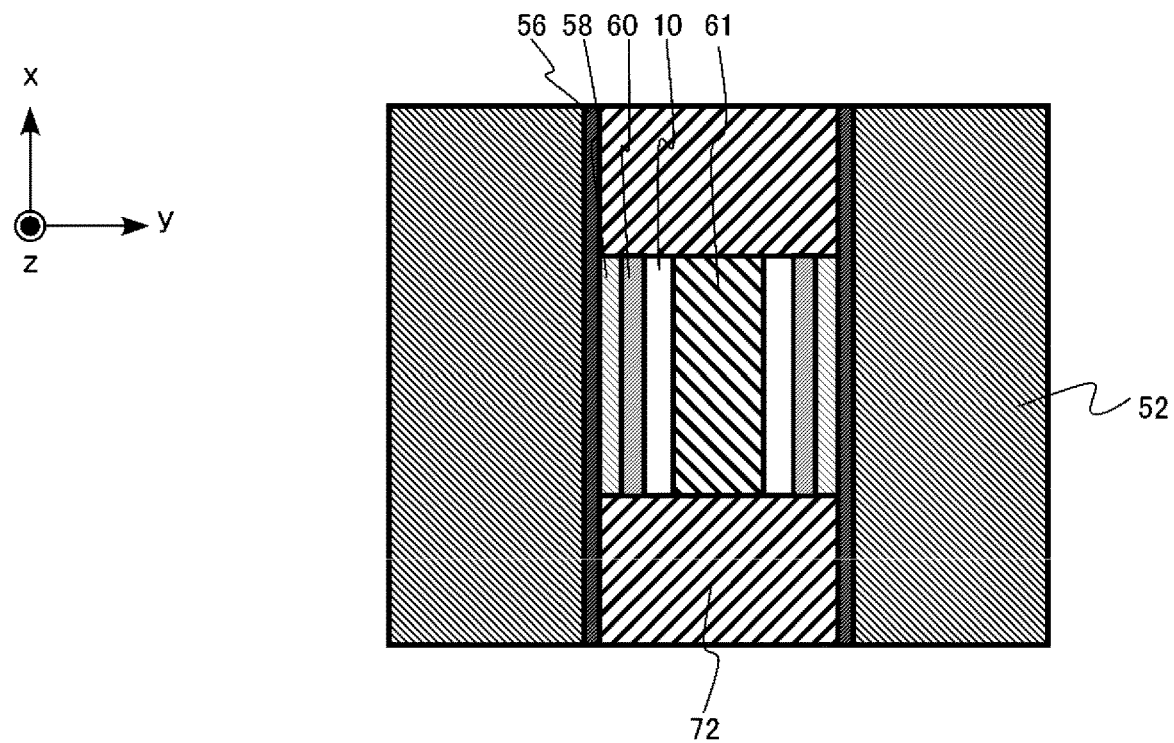

Next, the isolation hole 70 is filled with a silicon oxide layer 72 (FIGS. 23A and 23B). The silicon oxide layer 72 is the isolation insulating layer 27.

Figure 24A:
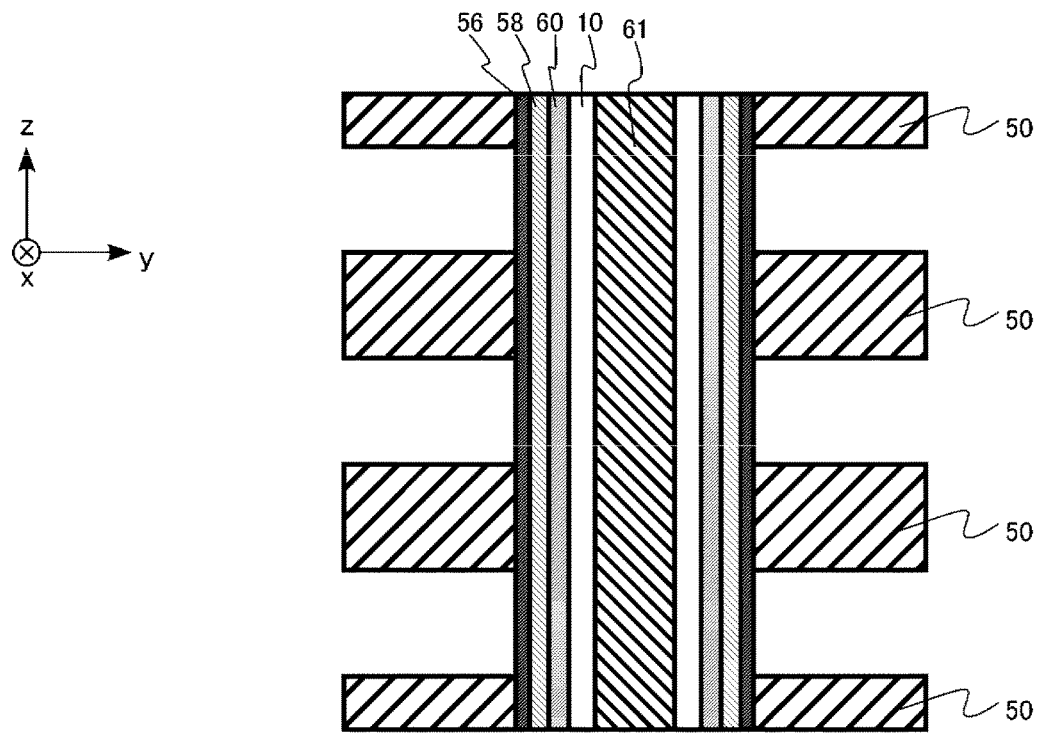
FIGS. 24A and 24B show schematic cross-sectional views showing the method of manufacturing the semiconductor storage device according to the second embodiment.
Figure 24B:
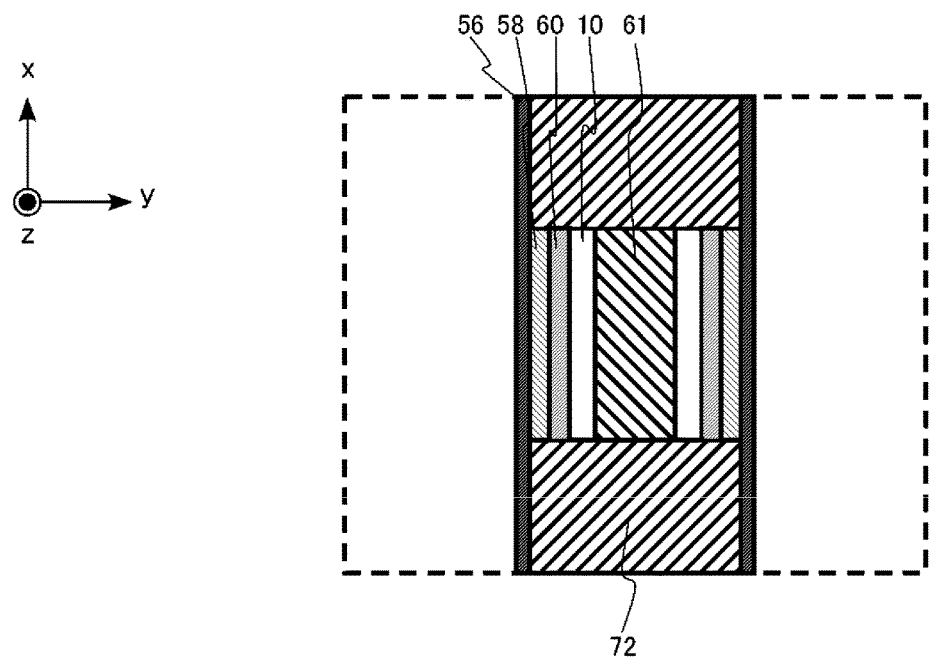

Next, the silicon nitride layers 52 are selectively removed by the wet etching using the opening (not shown) provided in the stacked body 30 as the groove for etching (FIGS. 24A and 24B). In the wet etching, for example, a phosphoric acid solution is used, and the silicon nitride layers 52 are selectively etched with respect to the silicon oxide layer 50 and the silicon oxide film 56.

Figure 25A:
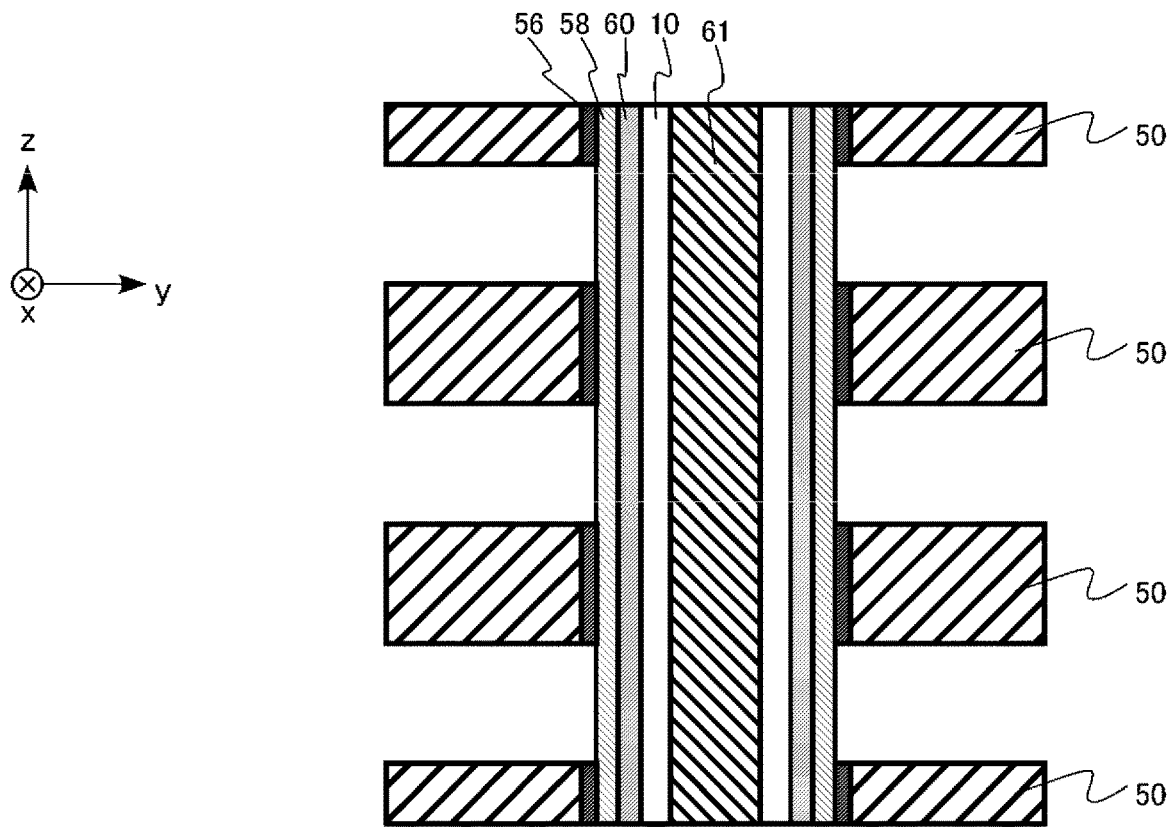
FIGS. 25A and 25B show schematic cross-sectional views showing the method of manufacturing the semiconductor storage device according to the second embodiment.
Figure 25B:
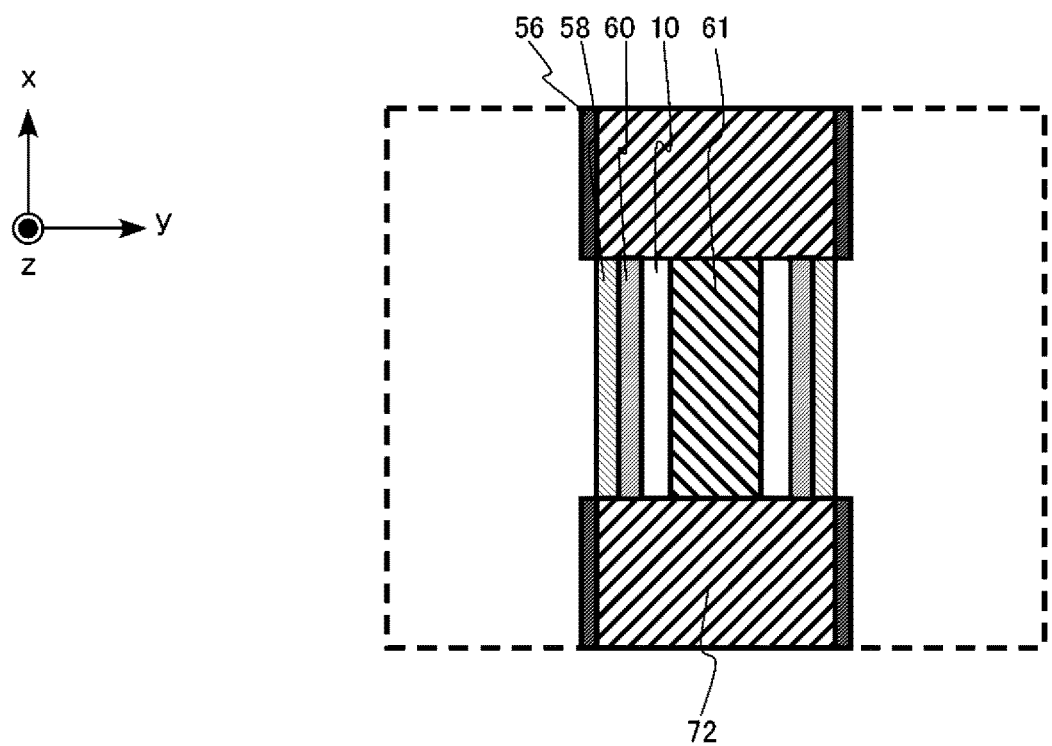

Next, the silicon oxide film 56 in the region where the silicon nitride layers 52 were removed is selectively removed with respect to the silicon nitride film 58 (FIGS. 25A and 25B). The silicon oxide film 56 is removed by, for example, the wet etching.

Figure 26A:
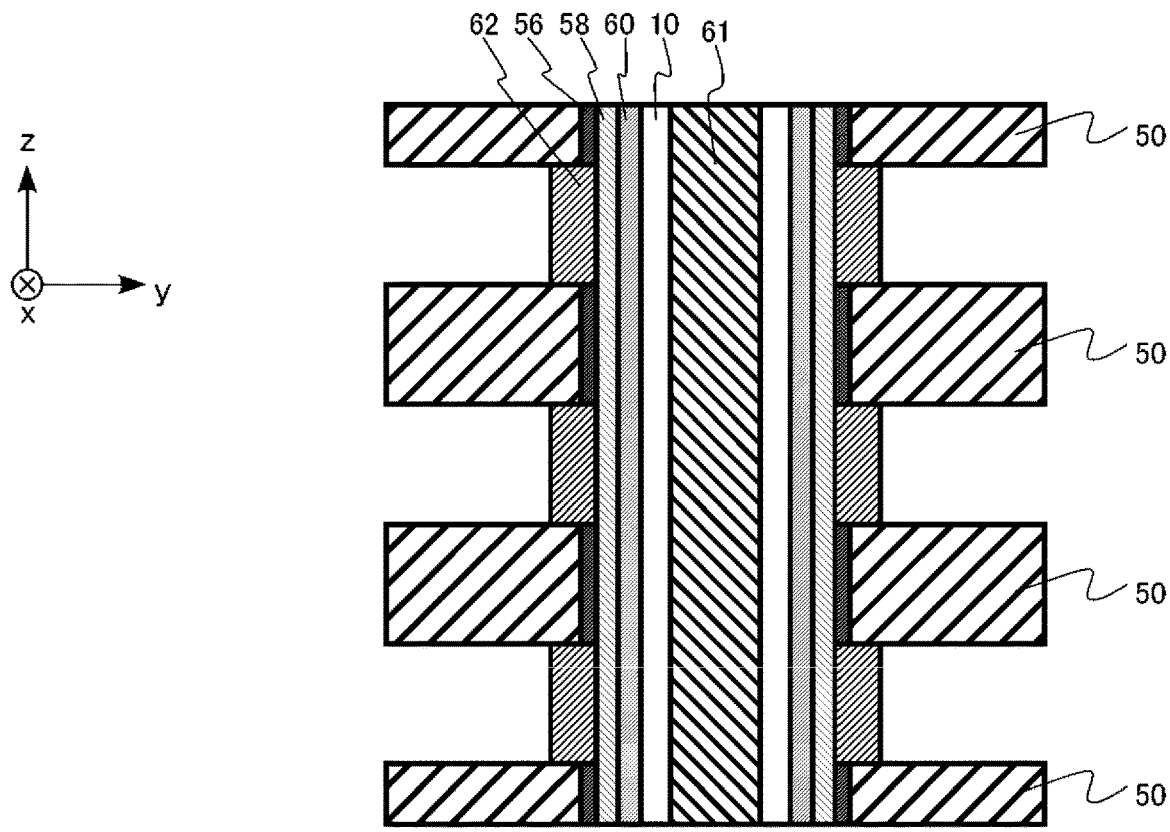
FIGS. 26A and 26B show schematic cross-sectional views showing the method of manufacturing the semiconductor storage device according to the second embodiment.
Figure 26B:
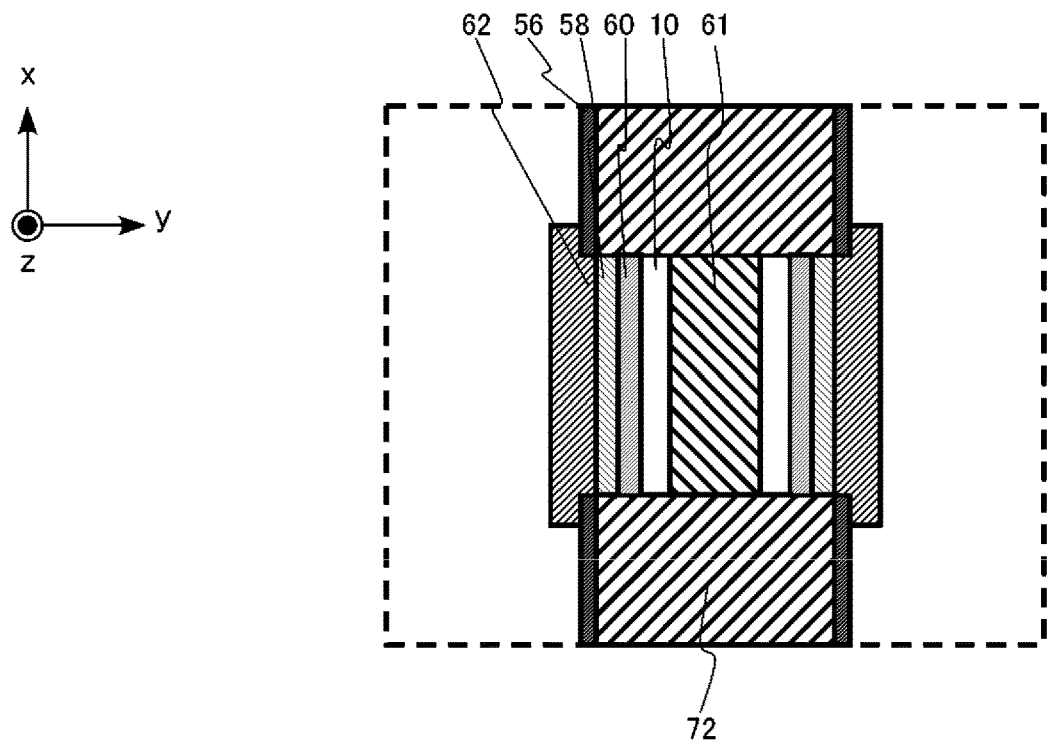

Next, the silicon nitride layer 62 is selectively formed on the silicon nitride film 58 (FIGS. 26A and 26B). The silicon nitride layer 62 is an example of the third layer. The silicon nitride layer 62 includes a chemical composition different from that of the silicon nitride film 58.

The atomic ratio (Si/N) of the silicon (Si) to the nitrogen (N) of the silicon nitride layer 62 is higher than the atomic ratio (Si/N) of the silicon (Si) to the nitrogen (N) of the silicon nitride film 58, for example.

The silicon nitride layer 62 includes, for example, a metal. The silicon nitride layer 62 includes, for example, aluminum (Al) or titanium (Ti).

The silicon nitride layer 62 includes, for example, boron (B), phosphorus (P), or germanium (Ge).

The silicon nitride layer 62 is formed by, for example, the CVD method. The silicon nitride layer 62 is selectively grown on the silicon nitride film 58 using the silicon nitride film 58 as a seed film. A part of the silicon nitride layer 62 is finally manufactured into the charge storage layer 18.

Figure 27A:
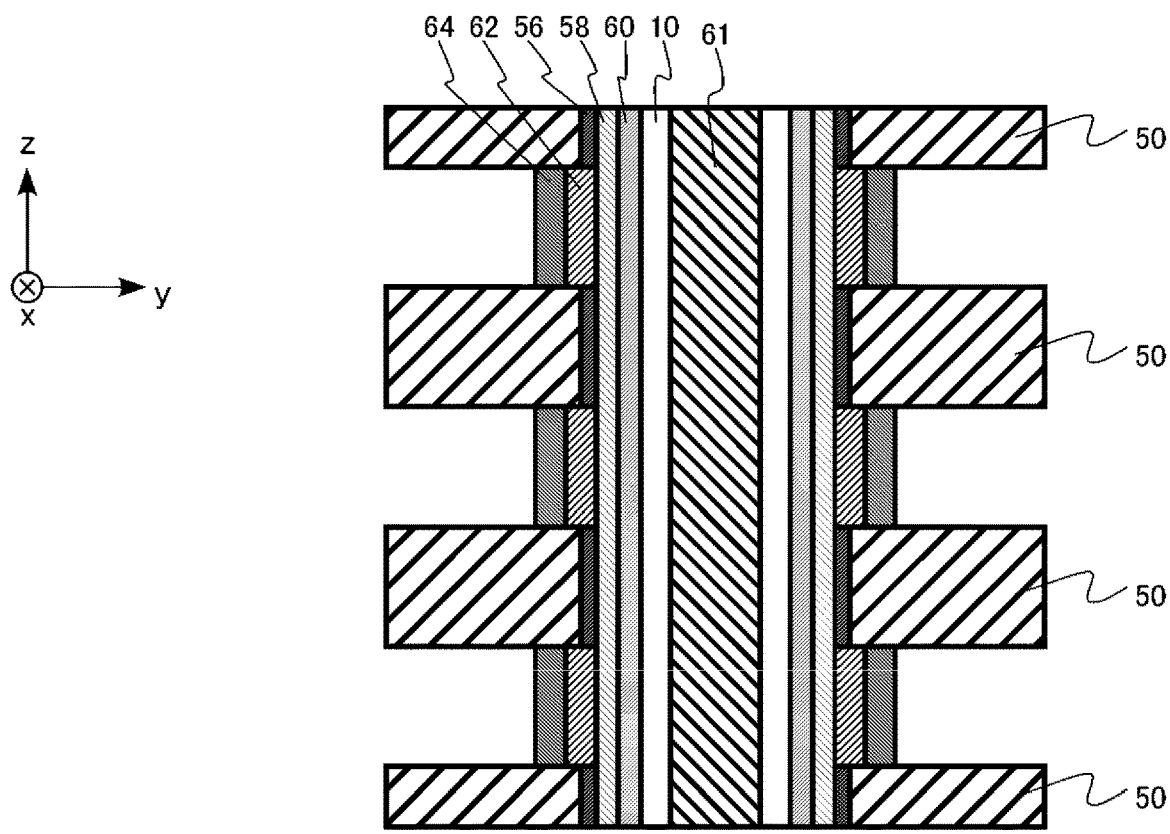
FIGS. 27A and 27B show schematic cross-sectional views showing the method of manufacturing the semiconductor storage device according to the second embodiment.
Figure 27B:
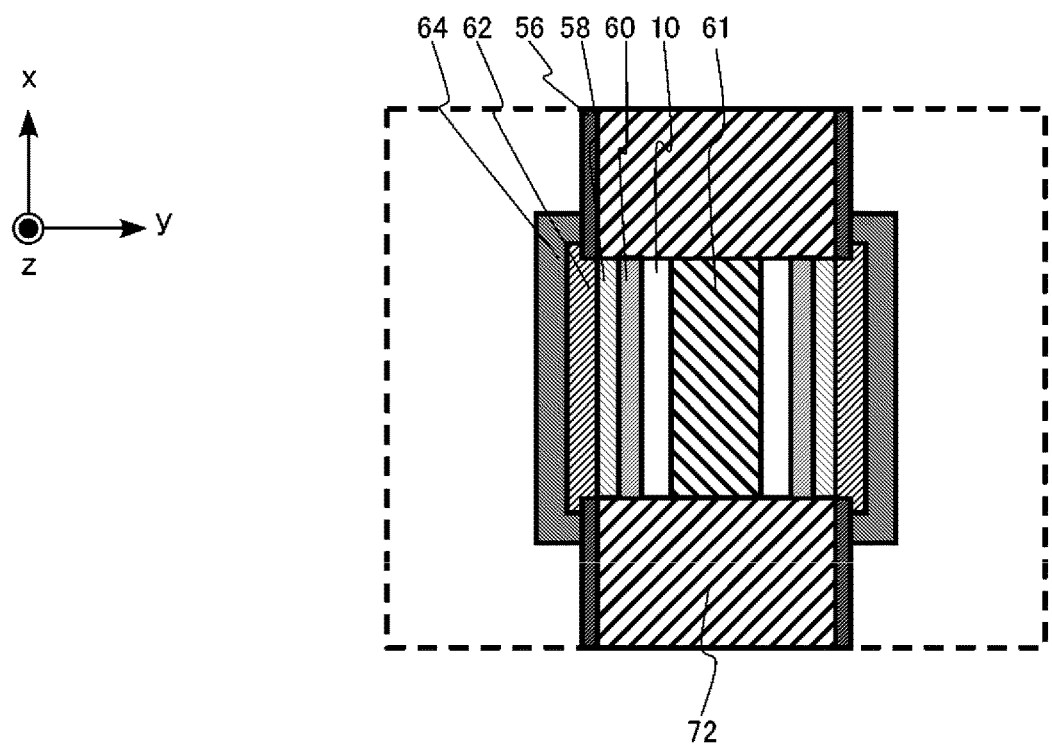

Next, the silicon oxide layer 64 is formed on the silicon nitride layer 62 (FIGS. 27A and 27B). The silicon oxide layer 64 is an example of the fourth layer.

The silicon oxide layer 64 is formed by, for example, thermally oxidizing a part of the silicon nitride layer 62. The silicon oxide layer 64 is the lower block insulating layer 20.

Figure 28A:
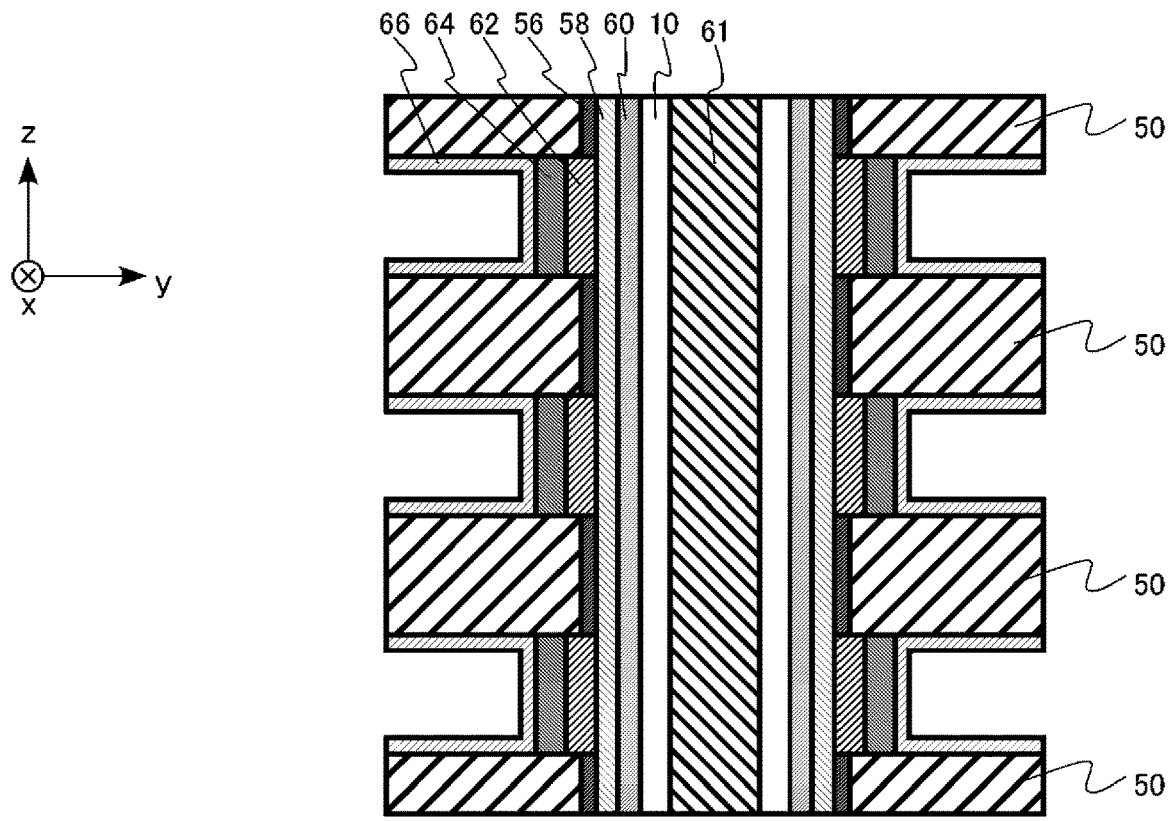
FIGS. 28A and 28B show schematic cross-sectional views showing the method of manufacturing the semiconductor storage device according to the second embodiment.
Figure 28B:
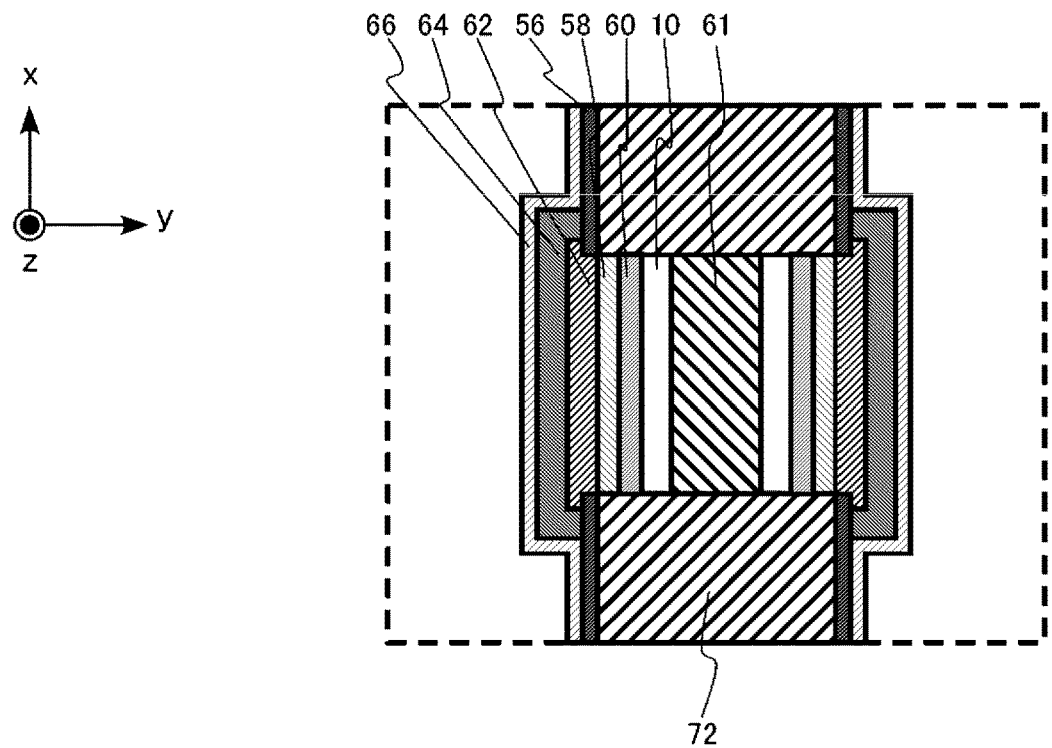

Next, the aluminum oxide layer 66 is formed on the silicon oxide layer 64 (FIGS. 28A and 28B). The aluminum oxide layer 66 is formed by, for example, a CVD method. The aluminum oxide layer 66 is the upper block insulating layers 22.

Figure 29A:
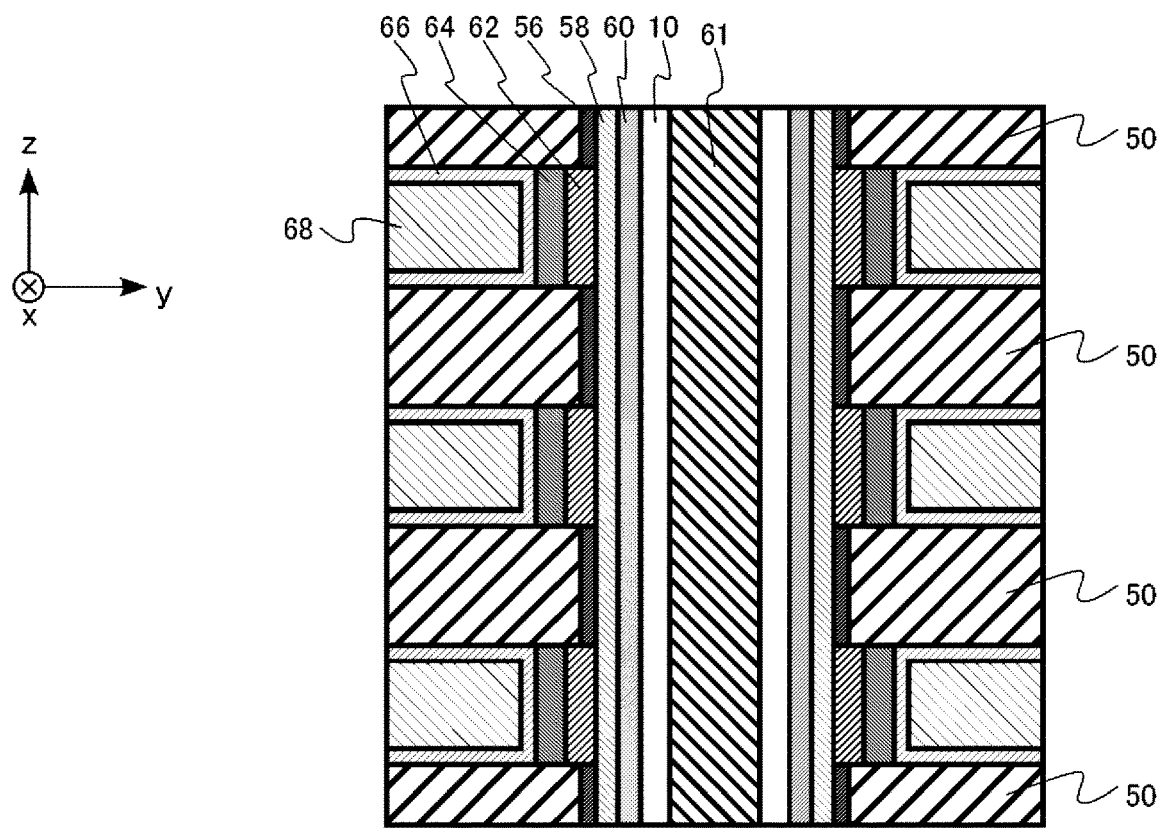
FIGS. 29A and 29B show schematic cross-sectional views showing the method of manufacturing the semiconductor storage device according to the second embodiment.
Figure 29B:
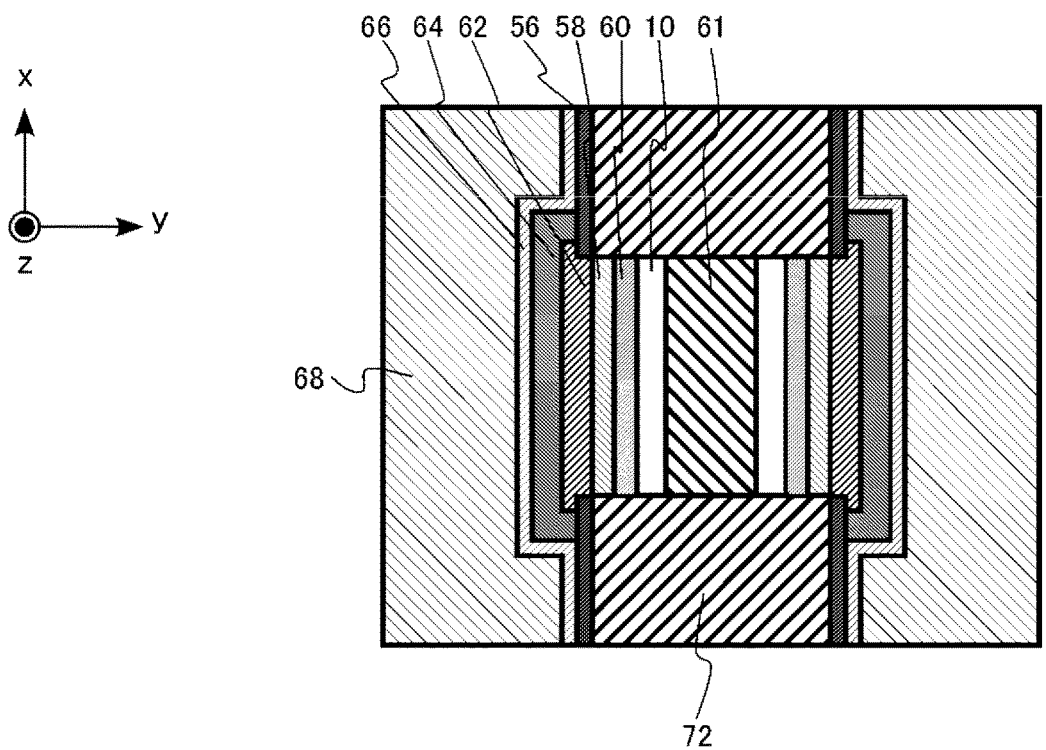

Next, the tungsten layer 68 is formed on the aluminum oxide layer 66 (FIGS. 29A and 29B). The tungsten layer 68 is an example of the metal layer. The tungsten layer 68 is formed by, for example, the CVD method.

The tungsten layers 68 are finally manufactured into the word lines WL1 and WL2. For example, a barrier metal film such as a titanium nitride film may be formed before the tungsten layer 68 is formed.

The memory cell array 200 of the semiconductor storage device according to the second embodiment is manufactured according to the manufacturing method described above.

In the memory cell array 200 of the second embodiment, charge storage layers 18 of two memory cells MCs adjacent to each other in the z direction are physically separated, similarly to the memory cell array 100 of the first embodiment. Therefore, the charges do not move through the charge storage layer. Therefore, the charge retention property is improved and the data retention failure is reduced according to some embodiments.

As described above, the semiconductor storage device capable of improving the charge retention property can be provided according to the second embodiment.

In the first and second embodiments, a case where the lower block insulating layer 20 and the upper block insulating layer 22 are provided as block insulating layers was described as an example. However, it is also possible to provide only one of the lower block insulating layer 20 and the upper block insulating layer 22 as the block insulating layer.

In the first or second embodiment, the interlayer insulating layer between the gate electrode layers may be, for example, a cavity.

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a stacked body having a plurality of insulating layers and a plurality of gate electrode layers alternately stacked in a first direction, the plurality of gate electrode layers including a first gate electrode layer and a second gate electrode layer, the second gate electrode layer adjacent to the first gate electrode layer in the first direction, and the plurality of insulating layers including a first insulating layer located between the first gate electrode layer and the second gate electrode layer;
a semiconductor layer extending in the first direction;
a first charge storage layer disposed between the semiconductor layer and the first gate electrode layer, the first charge storage layer including silicon (Si) and nitrogen (N);
a second charge storage layer disposed between the semiconductor layer and the second gate electrode layer, the second charge storage layer sandwiching the first insulating layer with the first charge storage layer, and including silicon (Si) and nitrogen (N) separated from the first charge storage layer;
a first insulating film disposed between the semiconductor layer and the first charge storage layer, between the semiconductor layer and the second charge storage layer, and between the semiconductor layer and the first insulating layer;
a second insulating film disposed:
between the first insulating film and the first charge storage layer,
between the first insulating film and the second charge storage layer, and
between the first insulating film and the first insulating layer, the second insulating film including silicon (Si) and nitrogen (N), being in contact with the first charge storage layer and the second charge storage layer, and having a chemical composition different from that of the first charge storage layer and from that of the second charge storage layer; and a second insulating layer disposed between the first charge storage layer and the first gate electrode layer.

2. The semiconductor storage device according to claim 1, wherein a width of the first charge storage layer in the first direction is equal to or larger than a width of the first gate electrode layer in the first direction.

3. The semiconductor storage device according to claim 1, wherein the first charge storage layer is a silicon nitride layer, the second charge storage layer is a silicon nitride layer, and the second insulating film is a silicon nitride film.

4. The semiconductor storage device according to claim 3, wherein an atomic ratio of the silicon (Si) to the nitrogen (N) of the first charge storage layer is higher than an atomic ratio of the silicon (Si) to the nitrogen (N) of the second insulating film.

5. The semiconductor storage device according to claim 3, wherein the first charge storage layer contains metal.

6. The semiconductor storage device according to claim 5, wherein the metal is aluminum (Al) or titanium (Ti).

7. The semiconductor storage device according to claim 3, wherein the first charge storage layer includes boron (B), phosphorus (P), or germanium (Ge).

8. The semiconductor storage device according to claim 1, wherein the first insulating film is a film including silicon (Si) and oxygen (O).

9. The semiconductor storage device according to claim 1, wherein the second insulating layer is a silicon oxide layer.

10. The semiconductor storage device according to claim 1, wherein a width of the second insulating layer in the first direction is substantially the same as a width of the first charge storage layer in the first direction.

11. The semiconductor storage device according to claim 1, wherein the second insulating layer is provided between the first gate electrode layer and the first insulating layer, and the second insulating layer is in contact with the first insulating layer.

12. The semiconductor storage device according to claim 1, wherein the second insulating layer includes a first portion and a second portion, the second portion located between the first portion and the first gate electrode layer, the first portion includes silicon oxide, and the second portion includes aluminum oxide.

13. The semiconductor storage device according to claim 12, wherein the second portion is in contact with the first insulating layer.

* * * * *